US011557716B2

United States Patent
Gibb et al.

(10) Patent No.: US 11,557,716 B2
(45) Date of Patent: *Jan. 17, 2023

(54) METHOD AND STRUCTURE OF SINGLE CRYSTAL ELECTRONIC DEVICES WITH ENHANCED STRAIN INTERFACE REGIONS BY IMPURITY INTRODUCTION

(71) Applicant: Akoustis, Inc., Huntersville, NC (US)

(72) Inventors: Shawn R. Gibb, Huntersville, NC (US); Steven Denbaars, Goleta, CA (US); Jeffrey B. Shealy, Cornelius, NC (US)

(73) Assignee: Akoustis, Inc., Huntersville, NC (US)

( * ) Notice: Subject to any disclaimer, the term of this patent is extended or adjusted under 35 U.S.C. 154(b) by 1052 days.

This patent is subject to a terminal disclaimer.

(21) Appl. No.: 15/900,599

(22) Filed: Feb. 20, 2018

(65) Prior Publication Data

US 2019/0259934 A1    Aug. 22, 2019

(51) Int. Cl.
*H01L 41/319* (2013.01)
*H01L 41/08* (2006.01)
(Continued)

(52) U.S. Cl.
CPC .......... *H01L 41/319* (2013.01); *C30B 23/025* (2013.01); *C30B 25/183* (2013.01);
(Continued)

(58) Field of Classification Search
CPC ......... H01L 41/18; H01L 41/23; H01L 41/27; H01L 41/29; H01L 41/083; H01L 41/316;
(Continued)

(56) References Cited

U.S. PATENT DOCUMENTS

| 5,231,327 A | 7/1993 | Ketcham |
| 5,894,647 A | 4/1999 | Lakin |

(Continued)

FOREIGN PATENT DOCUMENTS

| JP | 2010-068109 A | 3/2010 |
| WO | WO 2005/034349 A1 | 4/2005 |

(Continued)

OTHER PUBLICATIONS

International Search Report for PCT/US2015/034560, dated Sep. 18, 2015.

(Continued)

*Primary Examiner* — Emily P Pham
*Assistant Examiner* — Monica Mata

(57) ABSTRACT

A method of manufacture and resulting structure for a single crystal electronic device with an enhanced strain interface region. The method of manufacture can include forming a nucleation layer overlying a substrate and forming a first and second single crystal layer overlying the nucleation layer. This first and second layers can be doped by introducing one or more impurity species to form a strained single crystal layers. The first and second strained layers can be aligned along the same crystallographic direction to form a strained single crystal bi-layer having an enhanced strain interface region. Using this enhanced single crystal bi-layer to form active or passive devices results in improved physical characteristics, such as enhanced photon velocity or improved density charges.

26 Claims, 24 Drawing Sheets

(51) Int. Cl.
*H01L 41/18* (2006.01)
*H01L 41/316* (2013.01)
*C30B 25/18* (2006.01)
*C30B 23/02* (2006.01)
*C30B 29/40* (2006.01)
*C30B 31/06* (2006.01)
*H01L 41/338* (2013.01)
*H01L 41/29* (2013.01)
*H01L 41/332* (2013.01)
*H01L 41/331* (2013.01)
*H01L 41/23* (2013.01)

(52) U.S. Cl.
CPC ............ *C30B 29/403* (2013.01); *C30B 31/06* (2013.01); *H01L 41/0815* (2013.01); *H01L 41/18* (2013.01); *H01L 41/316* (2013.01); *H01L 41/23* (2013.01); *H01L 41/29* (2013.01); *H01L 41/331* (2013.01); *H01L 41/332* (2013.01); *H01L 41/338* (2013.01)

(58) Field of Classification Search
CPC ... H01L 41/319; H01L 41/331; H01L 41/332; H01L 41/338; H01L 41/0815; C30B 23/025; C30B 25/183; C30B 29/403; C30B 31/06; Y10T 29/42
USPC ........................................................ 29/25.35
See application file for complete search history.

(56) References Cited

U.S. PATENT DOCUMENTS

| | | | |
|---|---|---|---|
| 6,051,907 A | 4/2000 | Ylilammi | |
| 6,114,635 A | 9/2000 | Lakin et al. | |
| 6,262,637 B1 | 7/2001 | Bradley et al. | |
| 6,377,137 B1 | 4/2002 | Ruby | |
| 6,384,697 B1 | 5/2002 | Ruby | |
| 6,472,954 B1 | 10/2002 | Ruby et al. | |
| 6,617,060 B2 | 9/2003 | Weeks, Jr. et al. | |
| 6,812,619 B1 | 11/2004 | Kaitila et al. | |
| 6,841,922 B2 | 1/2005 | Aigner et al. | |
| 6,864,619 B2 | 3/2005 | Aigner et al. | |
| 6,879,224 B2 | 4/2005 | Frank | |
| 6,909,340 B2 | 6/2005 | Aigner et al. | |
| 6,933,807 B2 | 8/2005 | Marksteiner et al. | |
| 7,112,860 B2 | 9/2006 | Saxler | |
| 7,250,360 B2 | 7/2007 | Shealy et al. | |
| 7,268,436 B2 | 9/2007 | Aigner et al. | |
| 7,365,619 B2 | 4/2008 | Aigner et al. | |
| 7,514,759 B1 | 4/2009 | Mehta et al. | |
| 7,875,910 B2 | 1/2011 | Sheppard et al. | |
| 7,982,363 B2 | 7/2011 | Chitnis | |
| 8,304,271 B2 | 11/2012 | Huang et al. | |
| 9,147,726 B2* | 9/2015 | Thapa | H01L 21/02502 |
| 10,581,398 B2* | 3/2020 | Gibb | H01L 41/22 |
| 2005/0255234 A1 | 11/2005 | Kanda et al. | |
| 2008/0284541 A1 | 11/2008 | Chitnis | |
| 2009/0033177 A1 | 2/2009 | Itaya et al. | |
| 2013/0176086 A1 | 7/2013 | Bradley et al. | |
| 2014/0132117 A1 | 5/2014 | Larson, III | |
| 2017/0264256 A1 | 9/2017 | Gibb et al. | |

FOREIGN PATENT DOCUMENTS

| | | |
|---|---|---|
| WO | 2017171856 A1 | 10/2017 |
| WO | 2017222990 A1 | 12/2017 |

OTHER PUBLICATIONS

PCT International Search Report for Application No. PCT/US2019/018550, dated May 30, 2019.

* cited by examiner

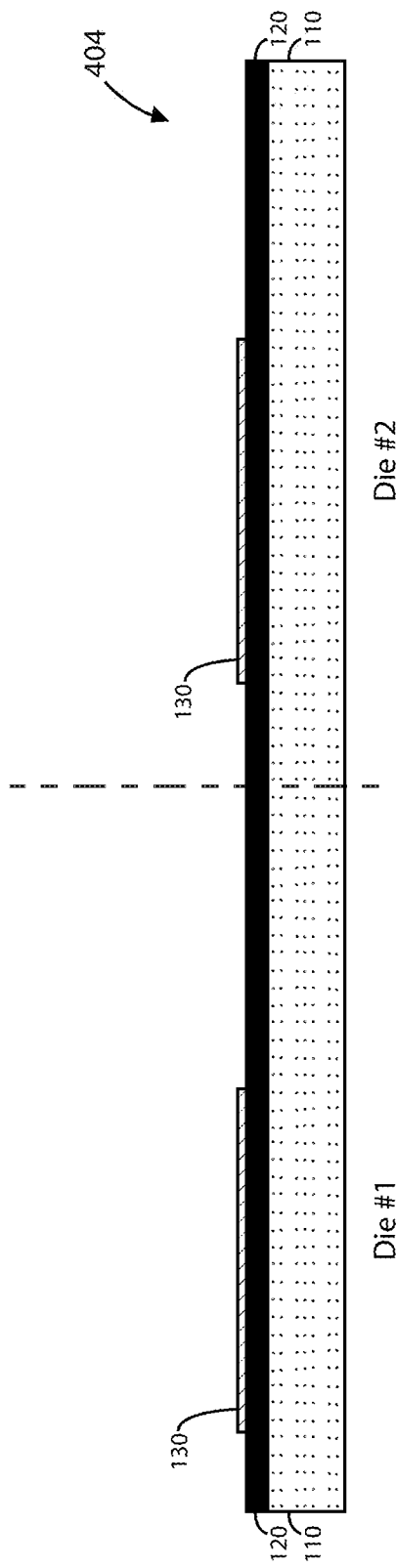
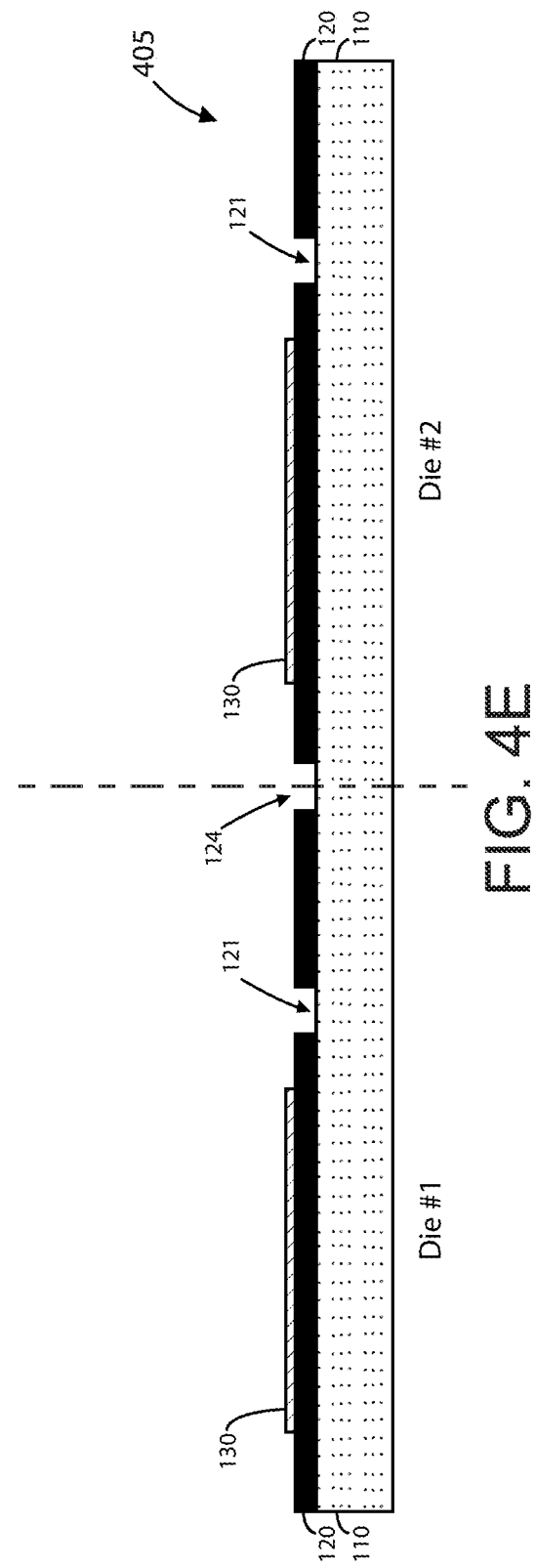

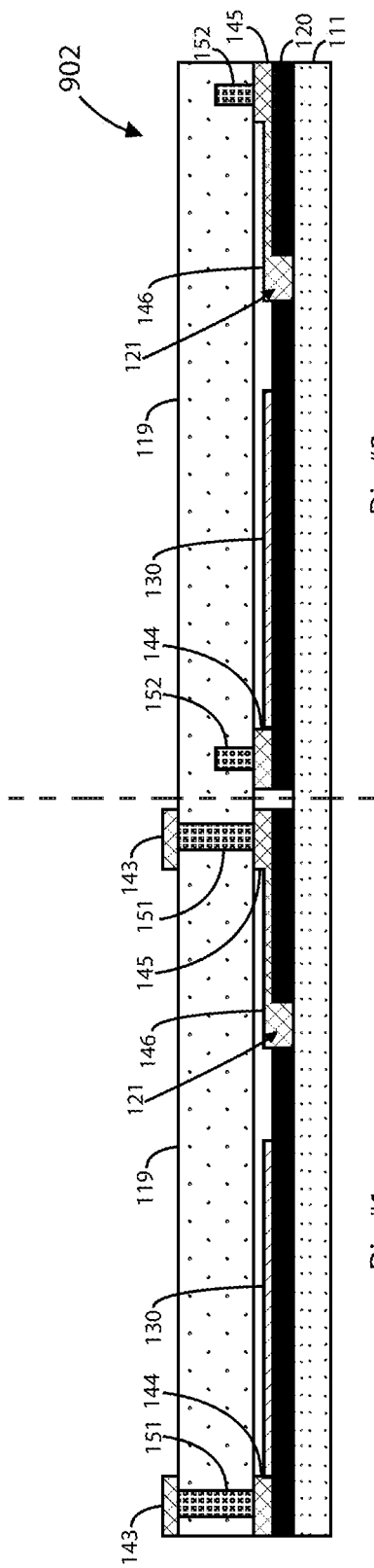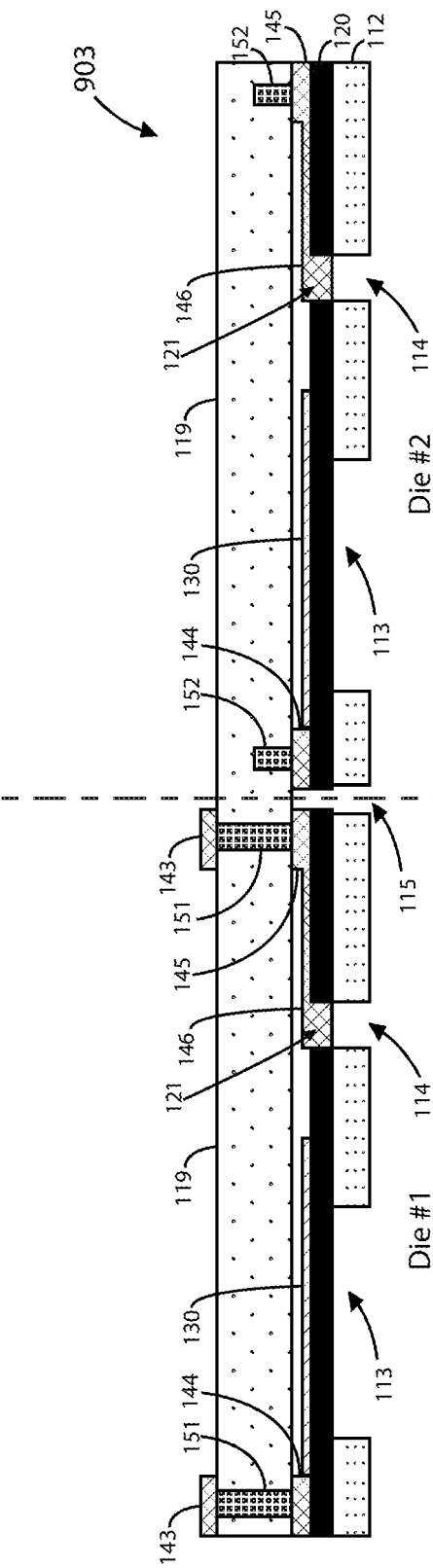
FIG. 9B
FIG. 9C

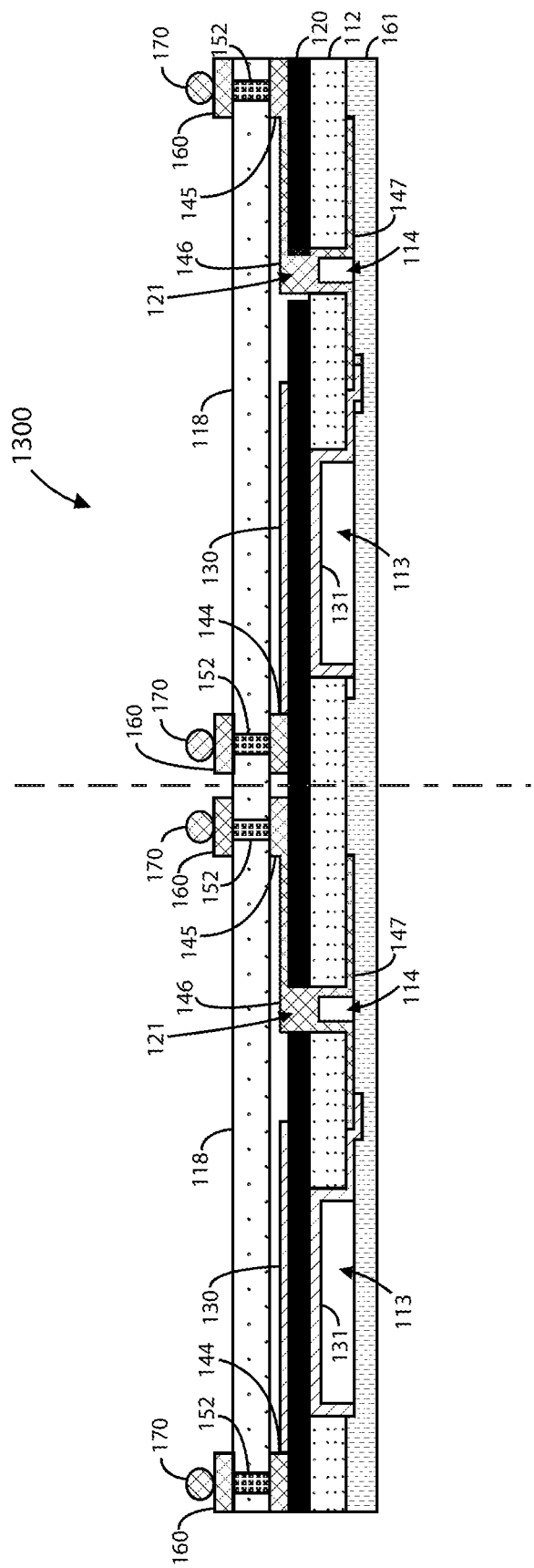

METHOD AND STRUCTURE OF SINGLE CRYSTAL ELECTRONIC DEVICES WITH ENHANCED STRAIN INTERFACE REGIONS BY IMPURITY INTRODUCTION

CROSS-REFERENCES TO RELATED APPLICATIONS

The present application incorporates by reference, for all purposes, the following patent applications, all commonly owner: U.S. patent application Ser. No. 15/221,358, filed Mar. 11, 2016, U.S. patent application Ser. No. 15/405,167, filed Jan. 12, 2017.

BACKGROUND OF THE INVENTION

The present invention relates generally to electronic devices. More particularly, the present invention provides techniques related to scandium incorporation in single crystal electronic devices. Merely by way of example, the invention has been applied to a single crystal resonator and filter device for communication devices, mobile devices, other mobile communications, computing devices, global positioning system (GPS) devices, military communications (MilCom), other infrastructure, etc., and other electronic devices such as high electron mobility transistors (HEMTs), low noise amplifiers (LNAs), switches, heterojunction bi-polar transistors (HBTs), etc., and combinations thereof.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

From the above, it is seen that techniques for improving electronic devices are highly desirable.

BRIEF SUMMARY OF THE INVENTION

The present invention relates generally to electronic devices. More particularly, the present invention provides techniques related to scandium incorporation in single crystal electronic devices. Merely by way of example, the invention has been applied to a single crystal resonator and filter device for communication devices, mobile devices, other mobile communications, computing devices, global positioning system (GPS) devices, military communications (MilCom), other infrastructure, etc., and other electronic devices such as high electron mobility transistors (HEMTs), low noise amplifiers (LNAs), switches, heterojunction bi-polar transistors (HBTs), etc., and combinations thereof.

Methods of the present invention provide for methods of impurity incorporation in single crystal electronic devices. By incorporating impurities, such as Scandium (Sc), one can adjust the piezoelectric properties of single crystal devices, which can be fabricated as group III nitride (III-N) based devices. More specifically, incorporating impurities can change the interatomic spacing in the crystal lattice of the single crystal material and generate additional strain. This method can be applied to adjacent single crystal layers to create enhanced strain interface regions exhibiting superior physical properties. Through impurity incorporation, properties of single crystal electronic devices can be tailored for specific applications, including various passive and active devices. An overview of the fabrication process and strain modification is provided below.

In an embodiment, the method of manufacture can include providing a substrate having the required material properties and crystallographic orientation. Various substrates can be used in the present method for fabricating single crystal electronic device such as Silicon, Sapphire, Silicon Carbide, Gallium Nitride (GaN) or Aluminum Nitride (AlN) bulk substrates. The present method can also use GaN templates, AlN templates, and $Al_xGa_{1-x}N$ templates (where x varies between 0.0 and 1.0). These substrates and templates can have polar, non-polar, or semi-polar crystallographic orientations.

A nucleation layer can be formed overlying the substrate surface region and being characterized by nucleation growth parameters. A first single crystal layer can be formed overlying the substrate surface region. This first layer can be doped by introducing one or more impurity species to form a first strained single crystal piezoelectric layer. The resulting first strained single crystal piezoelectric layer is characterized by a first strain condition and first piezoelectric layer parameters. Similarly, a second single crystal piezoelectric layer can be formed overlying the first single crystal piezoelectric layer and doped in a similar manner. The resulting second strained crystal piezoelectric layer is characterized by a second strain condition and second piezoelectric layer parameters.

The first and second strained single crystal piezoelectric layers form a strained single crystal bi-layer having an enhanced strain interface region. Using this enhanced single crystal bi-layer to form active or passive devices results in improved physical characteristics, such as enhanced photon velocity or improved density charges. In a specific embodiment, the forming of the first and second strained single crystal piezoelectric layers can include form the layers such that the first strain condition of the first layer and the second strain condition of the second layer are aligned in the same crystallographic direction at the interface region of the resulting strained single crystal bi-layer. This method can be applied to multiple layers to form multiple enhanced interface regions between strained single crystal layers. Those of ordinary skill in the art will recognize other variations, modifications, and alternatives.

One or more benefits are achieved over pre-existing techniques using the invention. In particular, the present device can be manufactured in a relatively simple and cost effective manner while using conventional materials and/or methods according to one of ordinary skill in the art. Using the present methods, one can create a reliable single crystal thin film electronic device using multiple ways of three-dimensional stacking through a wafer level process. Such methods provide the ability to selectively vary the concentration and properties of the impurities introduced into single crystal materials, e.g., III-N materials, which provide for improved device characteristics. These methods can be applied to devices such as sensors, actuators, power sources, motors, and the like. Depending upon the embodiment, one or more of these benefits may be achieved.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 4D and 4E are simplified diagrams illustrating an alternative method for conducting the method step of forming a topside micro-trench as described in FIG. 4A.

FIGS. 9B and 9C are simplified diagrams illustrating an alternative method for conducting the method step of forming backside trenches, as described in FIG. 9A, and simultaneously singulating a seed substrate according to an example of the present invention.

FIG. 13 is a simplified diagram illustrating a step for a method of manufacture for a single crystal electronic device according to an example of the present invention.

DETAILED DESCRIPTION OF THE INVENTION

The present invention relates generally to electronic devices. More particularly, the present invention provides techniques related to scandium incorporation in single crystal electronic devices. Merely by way of example, the invention has been applied to a single crystal resonator device for communication devices, mobile devices, computing devices, and other electronic devices.

Single crystal epitaxial materials can be used to fabricate a variety of electronic devices, including passive and active RF devices. Examples of passive devices include resonator and filter based devices; examples of active devices include transistors, switches, amplifiers, etc. Such single crystal devices can be fabricated as group III nitride (III-N) based devices that comprise any combination of Aluminum (Al), Gallium (Ga), Indium (In), Boron (B), Scandium (Sc), and Nitrogen (N); such combinations can form binary, ternary, and quaternary compounds. Modifying the strain state of the crystal lattice by introducing impurities in the single crystal materials changes the piezoelectric properties of the resulting fabricated devices.

When incorporated as an impurity element, Scandium generates a local distortion in the crystal lattice because Scandium has a larger atomic radius than the Al atoms. The Scandium source used for impurity incorporation may be a solid or gaseous state, pure, or compound derived. This incorporation changes the interatomic spacing in the lattice and generates additional strain. More particularly, when the strain is aligned in the same crystallographic direction (e.g., in monolithic single crystal thin films) the piezoelectric properties of the film can be modified and optimized for specific applications. For example, such strain modification for passive devices can enhance phonon velocity to improve coupling efficiency ($k^2$) of elements. For active devices, strain modification can enhance the strain at bi-layer interfaces to improve density of changes present in two-dimensional (2D) and three-dimensional (3D) electron gases. Those of ordinary skill in the art will recognize other variations, modifications, and alternatives.

Figure 1A:
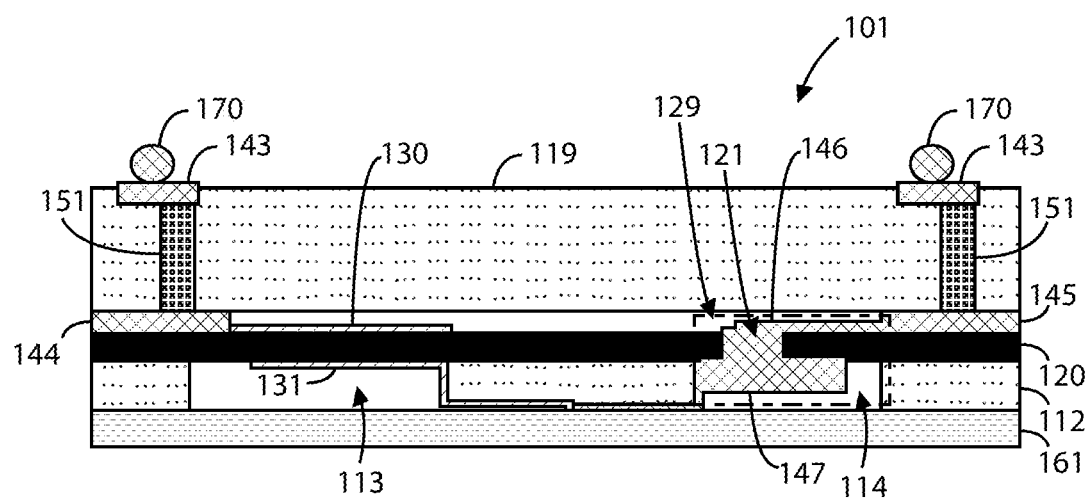
FIG. 1A is a simplified diagram illustrating a single crystal electronic device having topside interconnections according to an example of the present invention.

FIG. 1A is a simplified diagram illustrating a single crystal electronic device 101 having topside interconnections according to an example of the present invention. As shown, device 101 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 101 is depicted with a single micro-via 129, device 101 may have multiple micro-vias. A topside metal electrode 130 is formed overlying the piezoelectric layer 120. A top cap structure is bonded to the piezoelectric layer 120. This top cap structure includes an interposer substrate 119 with one or more through-vias 151 that are connected to one or more top bond pads 143, one or more bond pads 144, and topside metal 145 with topside metal plug 146. Solder balls 170 are electrically coupled to the one or more top bond pads 143.

The thinned substrate 112 has the first and second backside trenches 113, 114. A backside metal electrode 131 is formed underlying a portion of the thinned seed substrate 112, the first backside trench 113, and the topside metal electrode 130. The backside metal plug 147 is formed underlying a portion of the thinned seed substrate 112, the second backside trench 114, and the topside metal 145. This backside metal plug 147 is electrically coupled to the topside metal plug 146 and the backside metal electrode 131. A backside cap structure 161 is bonded to the thinned seed substrate 112, underlying the first and second backside trenches 113, 114. Further details relating to the method of manufacture of this device will be discussed starting from FIG. 2.

Figure 1B:
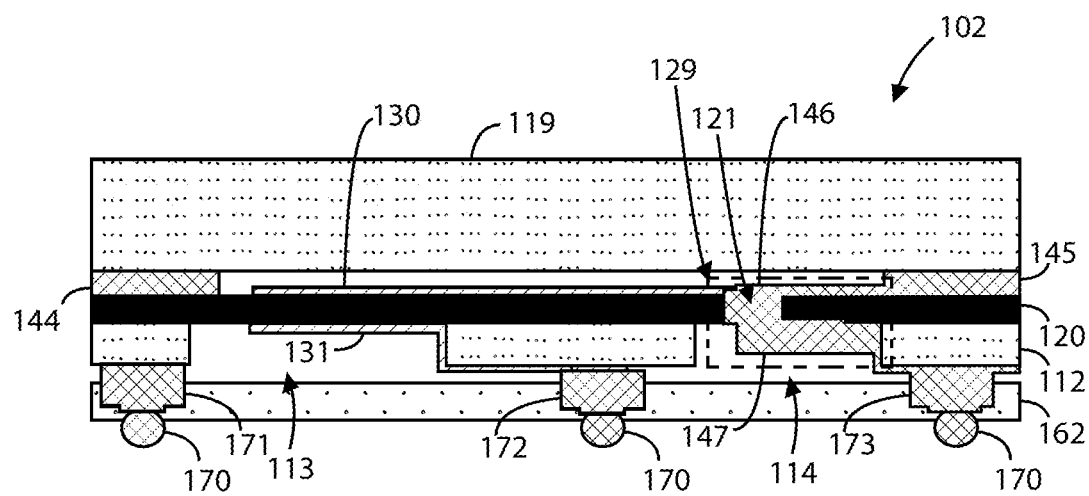
FIG. 1B is a simplified diagram illustrating a single crystal electronic device having bottom-side interconnections according to an example of the present invention.

FIG. 1B is a simplified diagram illustrating a single crystal electronic device 102 having backside interconnections according to an example of the present invention. As shown, device 101 includes a thinned seed substrate 112 with an overlying piezoelectric layer 120, which has a micro-via 129. The micro-via 129 can include a topside micro-trench 121, a topside metal plug 146, a backside trench 114, and a backside metal plug 147. Although device 102 is depicted with a single micro-via 129, device 102 may have multiple micro-vias. A topside metal electrode 130 is formed overlying the piezoelectric layer 120. A top cap structure is bonded to the piezoelectric layer 120. This top cap structure 119 includes bond pads which are connected to one or more bond pads 144 and topside metal 145 on piezoelectric layer 120. The topside metal 145 includes a topside metal plug 146.

The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal plug 146. This backside metal plug 147 is electrically coupled to the topside metal plug 146. A backside cap structure 162 is bonded to the thinned seed substrate 112, underlying the first and second backside trenches. One or more backside bond pads (171, 172, 173) are formed within one or more portions of the backside cap structure 162. Solder balls 170 are electrically coupled to the one or more backside bond pads 171-173. Further details relating to the method of manufacture of this device will be discussed starting from FIG. 14A.

Figure 1C:
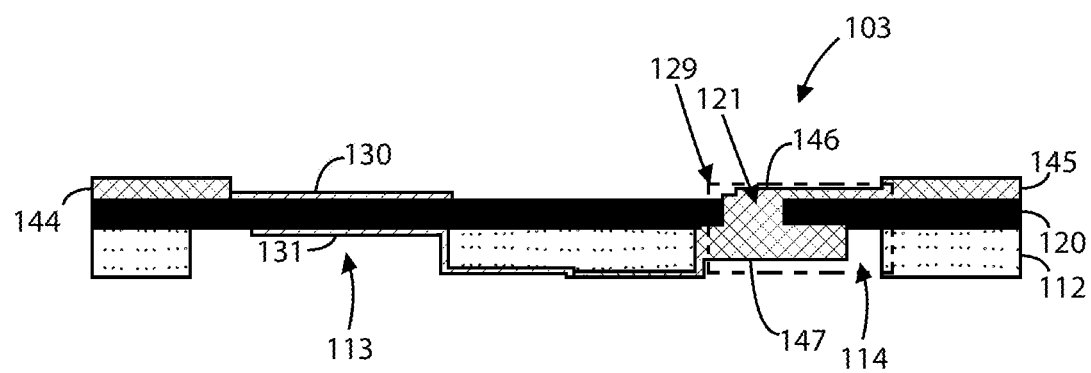
FIG. 1C is a simplified diagram illustrating a single crystal electronic device having interposer/cap-free structure interconnections according to an example of the present invention.

FIG. 1C is a simplified diagram illustrating a single crystal electronic device having interposer/cap-free structure interconnections according to an example of the present invention. As shown, device 103 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 103 is depicted with a single micro-via 129, device 103 may have multiple micro-vias. A topside metal electrode 130 is formed overlying the piezoelectric layer 120. The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal 145. This backside metal plug 147 is electrically coupled to the topside metal plug 146 and the backside metal electrode 131. Further details relating to the method of manufacture of this device will be discussed starting from FIG. 2.

Figure 1D:
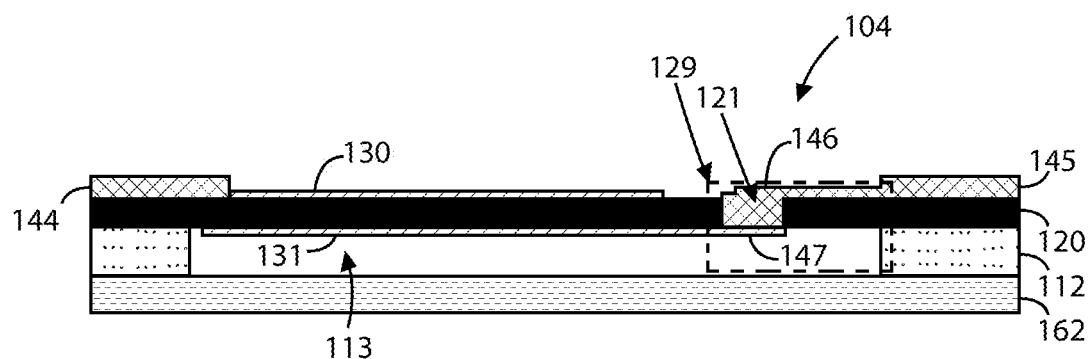
FIG. 1D is a simplified diagram illustrating a single crystal electronic device having interposer/cap-free structure interconnections with a shared backside trench according to an example of the present invention.

FIG. 1D is a simplified diagram illustrating a single crystal electronic device having interposer/cap-free structure interconnections with a shared backside trench according to an example of the present invention. As shown, device 104 includes a thinned seed substrate 112 with an overlying single crystal piezoelectric layer 120, which has a micro-via 129. The micro-via 129 can include a topside micro-trench 121, a topside metal plug 146, and a backside metal 147. Although device 104 is depicted with a single micro-via 129, device 104 may have multiple micro-vias. A topside metal electrode 130 is formed overlying the piezoelectric layer 120. The thinned substrate 112 has a first backside trench 113. A backside metal electrode 131 is formed underlying a portion of the thinned seed substrate 112, the first backside trench 113, and the topside metal electrode 130. A backside metal 147 is formed underlying a portion of the thinned seed substrate 112, the second backside trench 114, and the topside metal 145. This backside metal 147 is electrically coupled to the topside metal plug 146 and the backside metal electrode 131. Further details relating to the method of manufacture of this device will be discussed starting from FIG. 2.

Figure 2:
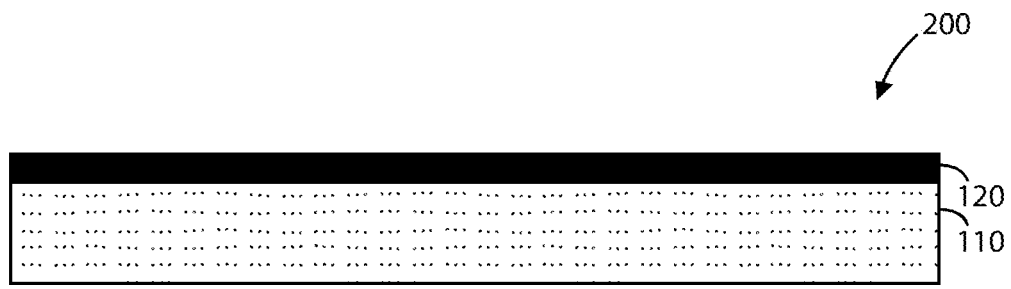
FIGS. 2 and 3 are simplified diagrams illustrating steps for a method of manufacture for a single crystal electronic device according to an example of the present invention.
Figure 3:
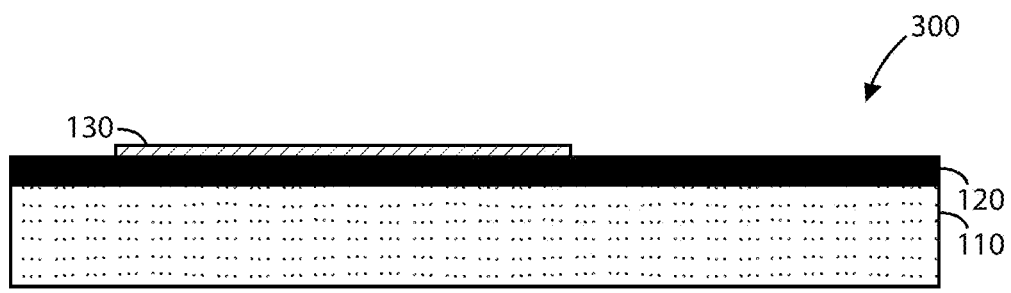

FIGS. 2 and 3 are simplified diagrams illustrating steps for a method of manufacture for a single crystal electronic device according to an example of the present invention. This method illustrates the process for fabricating a single crystal electronic device similar to that shown in FIG. 1A. FIG. 2 can represent a method step of providing a partially processed piezoelectric substrate. As shown, device 102 includes a seed substrate 110 with a piezoelectric layer 120 formed overlying. In a specific example, the seed substrate can include silicon, silicon carbide, aluminum oxide, or single crystal aluminum gallium nitride materials, or the like. The piezoelectric layer 120 can include a piezoelectric single crystal layer or a thin film piezoelectric single crystal layer.

FIG. 3 can represent a method step of forming a top side metallization or top resonator metal electrode 130. In a specific example, the topside metal electrode 130 can include a molybdenum, aluminum, ruthenium, or titanium material, or the like and combinations thereof. This layer can be deposited and patterned on top of the piezoelectric layer by a lift-off process, a wet etching process, a dry etching process, a metal printing process, a metal laminating process, or the like. The lift-off process can include a sequential process of lithographic patterning, metal deposition, and lift-off steps to produce the topside metal layer. The wet/dry etching processes can includes sequential processes of metal deposition, lithographic patterning, metal deposition, and metal etching steps to produce the topside metal layer. Those of ordinary skill in the art will recognize other variations, modifications, and alternatives.

Figure 4A:
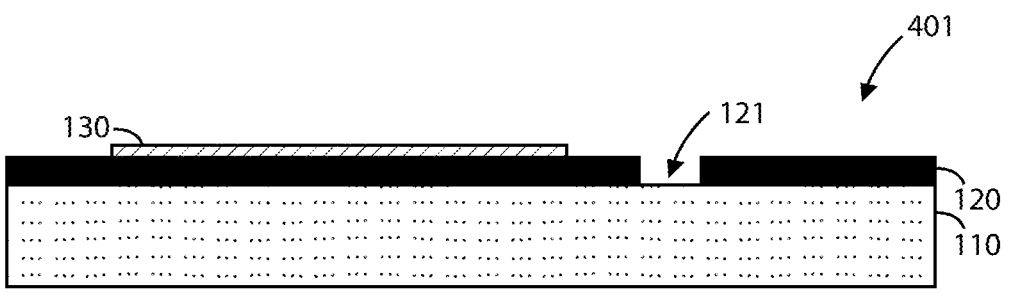
FIG. 4A is a simplified diagram illustrating a step for a method creating a topside micro-trench according to an example of the present invention.
Figure 4B:
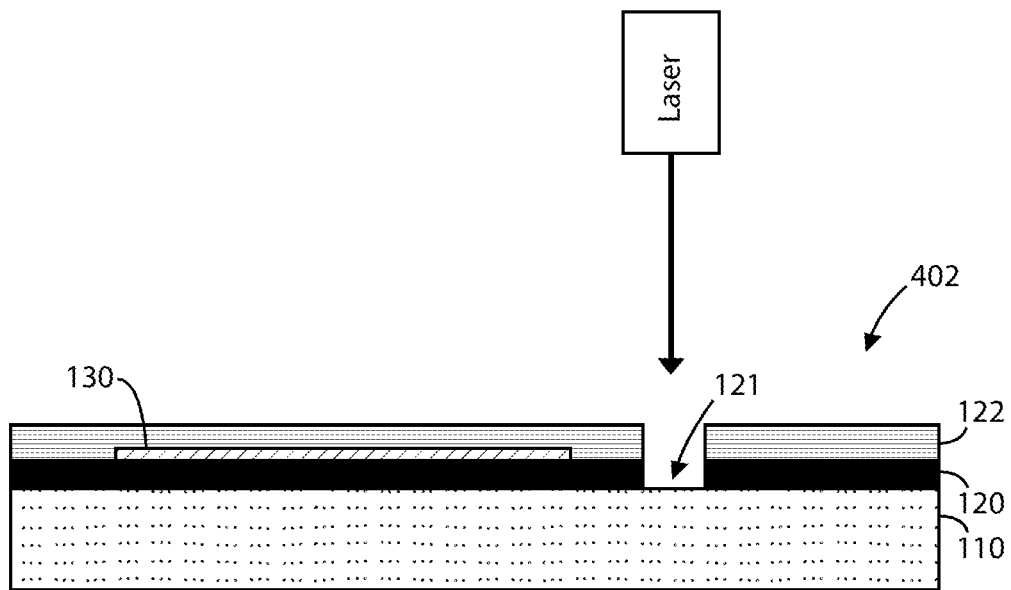
FIGS. 4B and 4C are simplified diagrams illustrating alternative methods for conducting the method step of forming a topside micro-trench as described in FIG. 4A.
Figure 4C:
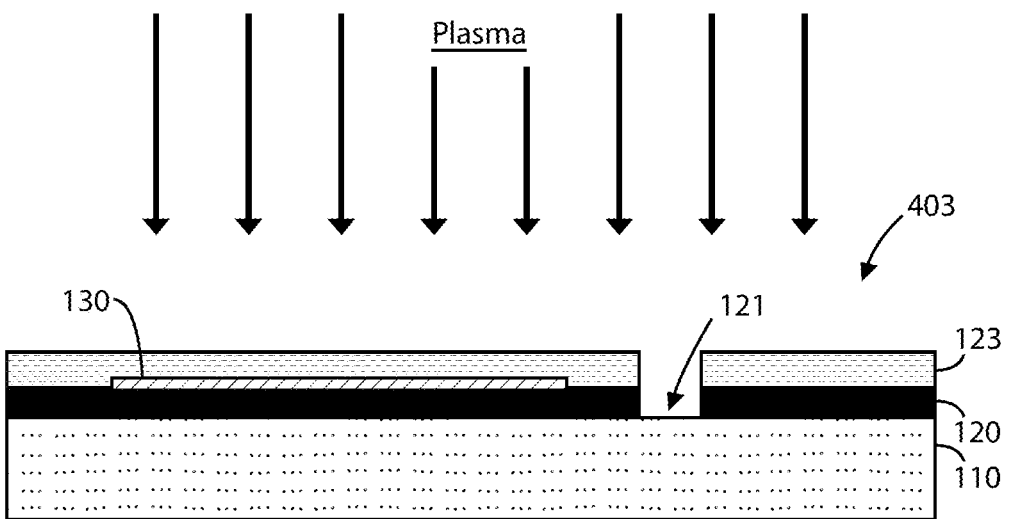

FIG. 4A is a simplified diagram illustrating a step for a method of manufacture for a single crystal electronic device 401 according to an example of the present invention. This figure can represent a method step of forming one or more topside micro-trenches 121 within a portion of the piezoelectric layer 120. This topside micro-trench 121 can serve as the main interconnect junction between the top and bottom sides of the acoustic membrane, which will be developed in later method steps. In an example, the topside micro-trench 121 is extends all the way through the piezoelectric layer 120 and stops in the seed substrate 110. This topside micro-trench 121 can be formed through a dry etching process, a laser drilling process, or the like. FIGS. 4B and 4C describe these options in more detail.

FIGS. 4B and 4C are simplified diagrams illustrating alternative methods for conducting the method step as described in FIG. 4A. As shown, FIG. 4B represents a method step of using a laser drill, which can quickly and accurately form the topside micro-trench 121 in the piezoelectric layer 120. In an example, the laser drill can be used to form nominal 50 um holes, or holes between 10 um and 500 um in diameter, through the piezoelectric layer 120 and stop in the seed substrate 110 below the interface between layers 120 and 110. A protective layer 122 can be formed overlying the piezoelectric layer 120 and the topside metal electrode 130. This protective layer 122 can serve to protect the device from laser debris and to provide a mask for the etching of the topside micro-via 121. In a specific example, the laser drill can be an 11W high power diode-pumped UV laser, or the like. This mask 122 can be subsequently removed before proceeding to other steps. The mask may also be omitted from the laser drilling process, and air flow can be used to remove laser debris.

FIG. 4C can represent a method step of using a dry etching process to form the topside micro-trench 121 in the piezoelectric layer 120. As shown, a lithographic masking layer 123 can be forming overlying the piezoelectric layer 120 and the topside metal electrode 130. The topside micro-trench 121 can be formed by exposure to plasma, or the like.

FIGS. 4D and 4E are simplified diagrams illustrating an alternative method for conducting the method step as described in FIG. 4A. These figures can represent the method step of manufacturing multiple single crystal electronic devices simultaneously. In FIG. 4D, two devices are shown on Die #1 and Die #2, respectively. FIG. 4E shows the process of forming a micro-via 121 on each of these dies while also etching a scribe line 124 or dicing line. In an example, the etching of the scribe line 124 singulates and relieves stress in the piezoelectric single crystal layer 120.

Figure 5:
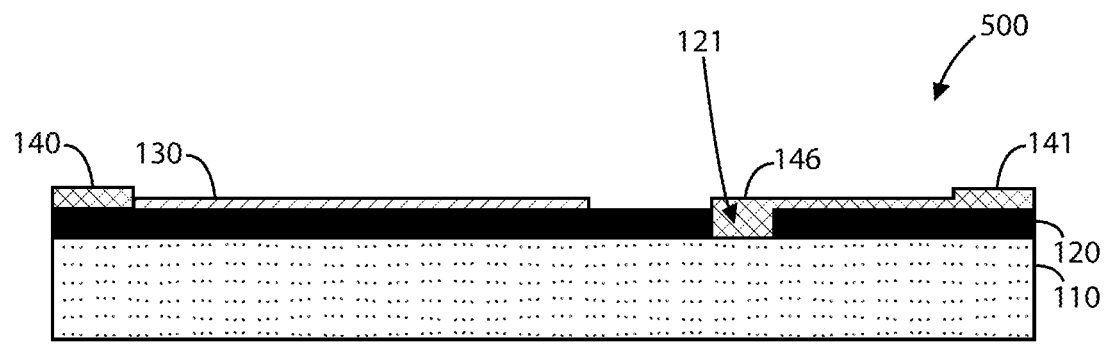
FIGS. 5 to 8 are simplified diagrams illustrating steps for a method of manufacture for a single crystal electronic device according to an example of the present invention.

FIGS. 5 to 8 are simplified diagrams illustrating steps for a method of manufacture for a single crystal electronic device according to an example of the present invention. FIG. 5 can represent the method step of forming one or more bond pads 140 and forming a topside metal 141 electrically coupled to at least one of the bond pads 140. The topside metal 141 can include a topside metal plug 146 formed within the topside micro-trench 121. In a specific example, the topside metal plug 146 fills the topside micro-trench 121 to form a topside portion of a micro-via.

In an example, the bond pads 140 and the topside metal 141 can include a gold material or other interconnect metal material depending upon the application of the device. These metal materials can be formed by a lift-off process, a wet etching process, a dry etching process, a screen-printing process, an electroplating process, a metal printing process, or the like. In a specific example, the deposited metal materials can also serve as bond pads for a cap structure, which will be described below.

Figure 6:
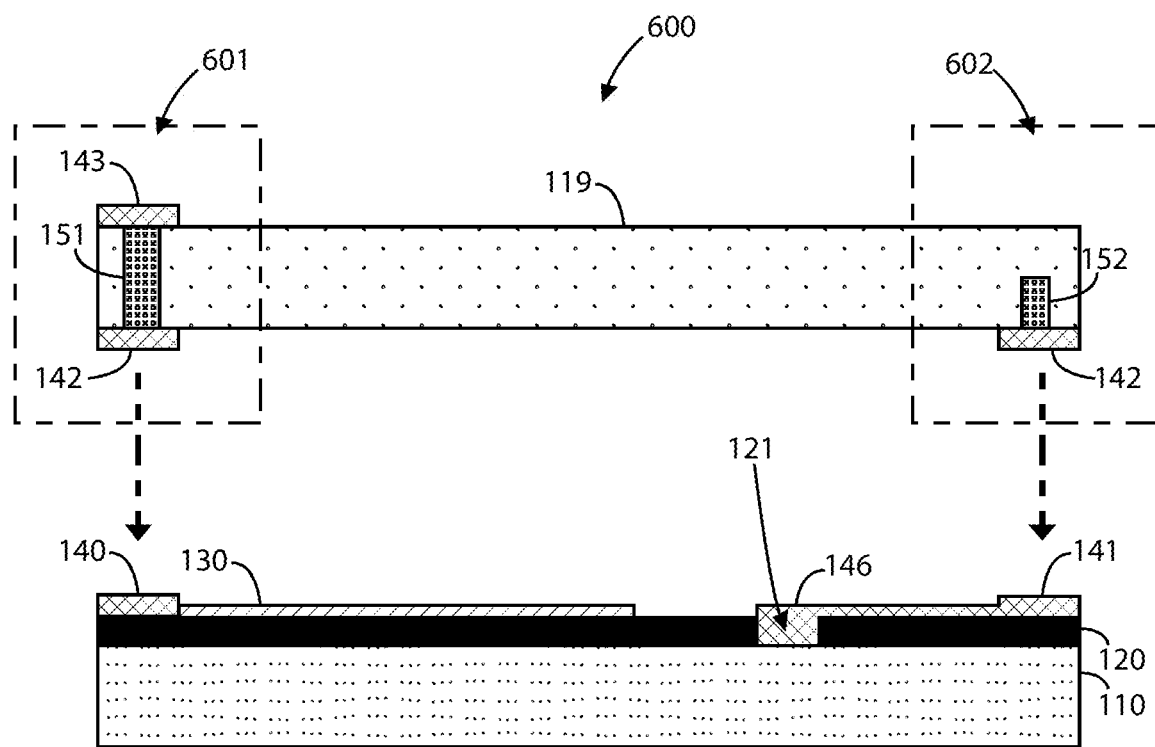

FIG. 6 can represent a method step for preparing the single crystal electronic device for bonding, which can be a hermetic bonding. As shown, a top cap structure is positioned above the partially processed single crystal electronic device as described in the previous figures. The top cap structure can be formed using an interposer substrate 119 in two configurations: fully processed interposer version 601 (through glass via) and partially processed interposer version 602 (blind via version). In the 601 version, the interposer substrate 119 includes through-via structures 151 that extend through the interposer substrate 119 and are electrically coupled to bottom bond pads 142 and top bond pads 143. In the 602 version, the interposer substrate 119 includes blind via structures 152 that only extend through a portion of the interposer substrate 119 from the bottom side. These blind via structures 152 are also electrically coupled to bottom bond pads 142. In a specific example, the interposer substrate can include a silicon, glass, smart-glass, or other like material.

Figure 7:
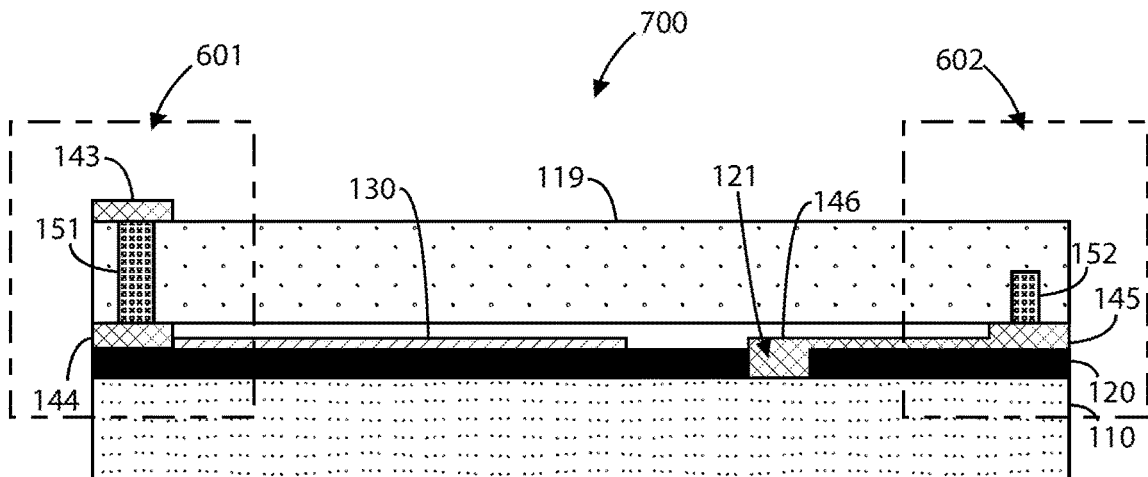
Figure 8:
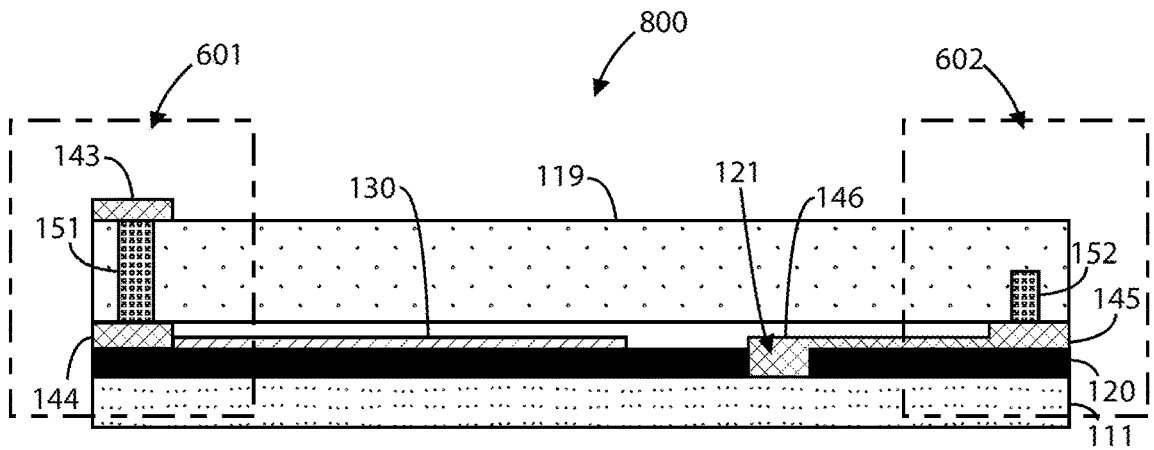

FIG. 7 can represent a method step of bonding the top cap structure to the partially processed single crystal electronic device. As shown, the interposer substrate 119 is bonded to the piezoelectric layer by the bond pads (140, 142) and the topside metal 141, which are now denoted as bond pad 144 and topside metal 145. This bonding process can be done using a compression bond method or the like. FIG. 8 can represent a method step of thinning the seed substrate 110, which is now denoted as thinned seed substrate 111. This substrate thinning process can include grinding and etching processes or the like. In a specific example, this process can include a wafer backgrinding process followed by stress removal, which can involve dry etching, CMP polishing, or annealing processes.

Figure 9A:
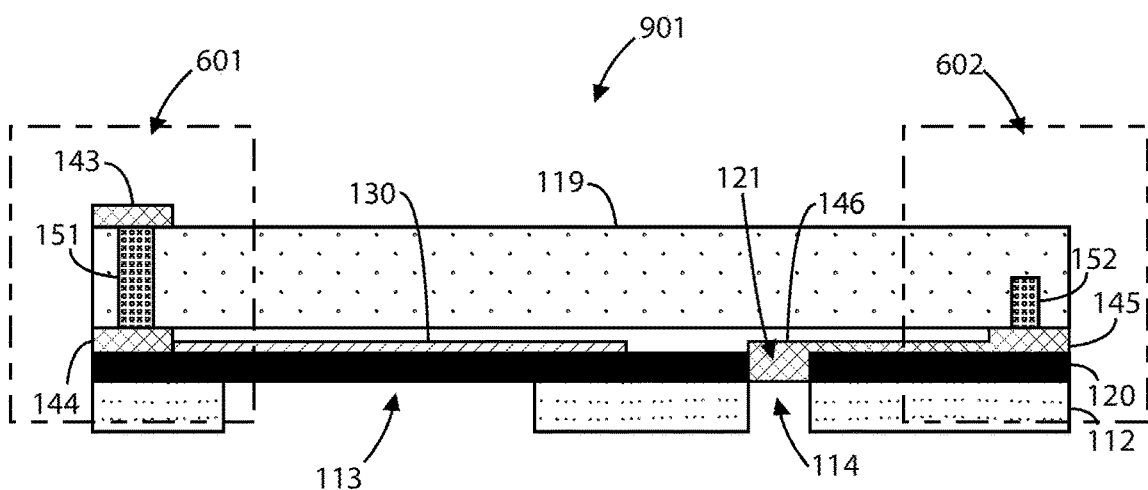
FIG. 9A is a simplified diagram illustrating a method step for forming backside trenches according to an example of the present invention.

FIG. 9A is a simplified diagram illustrating a step for a method of manufacture for a single crystal electronic device 901 according to an example of the present invention. FIG. 9A can represent a method step for forming backside trenches 113 and 114 to allow access to the piezoelectric layer from the backside of the thinned seed substrate 111. In an example, the first backside trench 113 can be formed within the thinned seed substrate 111 and underlying the topside metal electrode 130. The second backside trench 114 can be formed within the thinned seed substrate 111 and underlying the topside micro-trench 121 and topside metal plug 146. This substrate is now denoted thinned substrate 112. In a specific example, these trenches 113 and 114 can be formed using deep reactive ion etching (DRIE) processes, Bosch processes, or the like. The size, shape, and number of the trenches may vary with the design of the single crystal electronic device. In various examples, the first backside trench may be formed with a trench shape similar to a shape of the topside metal electrode or a shape of the backside metal electrode. The first backside trench may also be formed with a trench shape that is different from both a shape of the topside metal electrode and the backside metal electrode.

FIGS. 9B and 9C are simplified diagrams illustrating an alternative method for conducting the method step as described in FIG. 9A. Like FIGS. 4D and 4E, these figures can represent the method step of manufacturing multiple single crystal electronic devices simultaneously. In FIG. 9B, two devices with cap structures are shown on Die #1 and Die

2, respectively. FIG. 9C shows the process of forming backside trenches (113, 114) on each of these dies while also etching a scribe line 115 or dicing line. In an example, the etching of the scribe line 115 provides an optional way to singulate the backside wafer 112.

Figure 10:
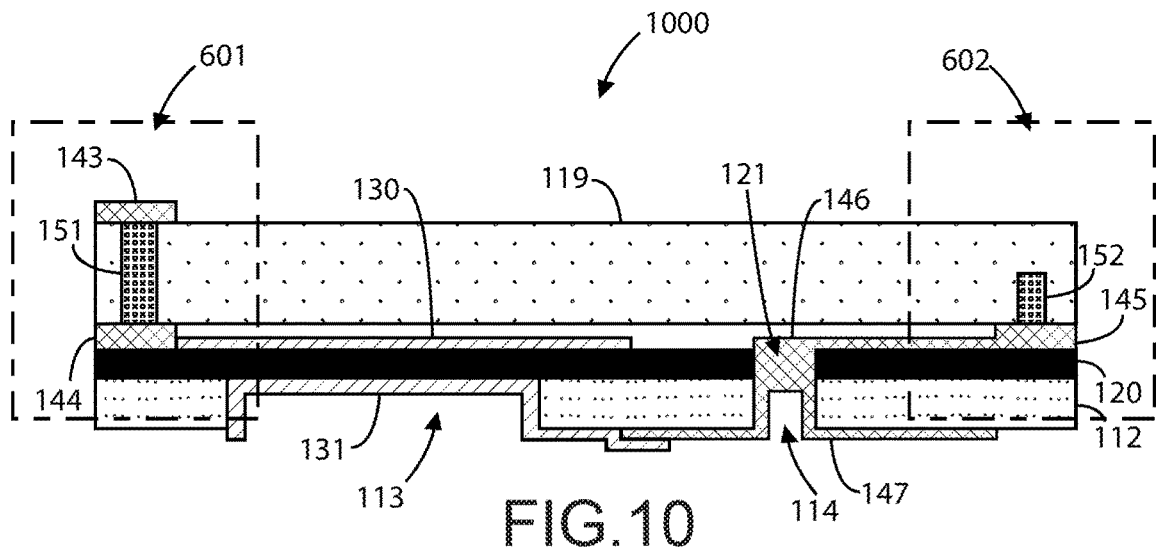
FIG. 10 is a simplified diagram illustrating a method step forming backside metallization and electrical interconnections between top and bottom sides of a single crystal electronic device according to an example of the present invention.

FIG. 10 is a simplified diagram illustrating a step for a method of manufacture for a single crystal electronic device 1000 according to an example of the present invention. This figure can represent a method step of forming a backside metal electrode 131 and a backside metal plug 147 within the backside trenches of the thinned seed substrate 112. In an example, the backside metal electrode 131 can be formed underlying one or more portions of the thinned substrate 112, within the first backside trench 113, and underlying the topside metal electrode 130. This process completes the resonator structure within the single crystal electronic device. The backside metal plug 147 can be formed underlying one or more portions of the thinned substrate 112, within the second backside trench 114, and underlying the topside micro-trench 121. The backside metal plug 147 can be electrically coupled to the topside metal plug 146 and the backside metal electrode 131. In a specific example, the backside metal electrode 130 can include a molybdenum, aluminum, ruthenium, or titanium material, or the like and combinations thereof. The backside metal plug can include a gold material, low resistivity interconnect metals, electrode metals, or the like. These layers can be deposited using the deposition methods described previously.

Figure 11A:
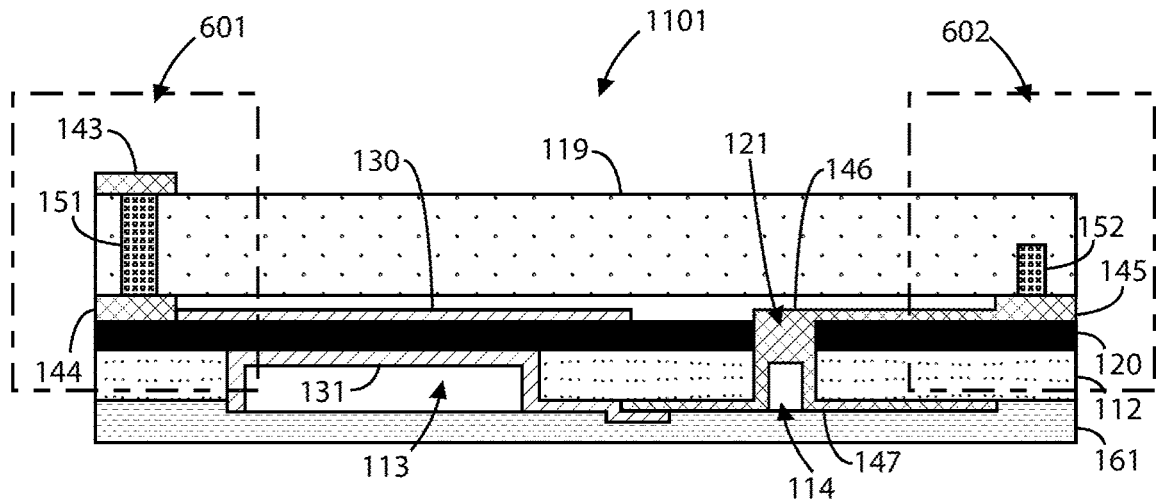
FIGS. 11A and 11B are simplified diagrams illustrating alternative steps for a method of manufacture for a single crystal electronic device according to an example of the present invention.
Figure 11B:
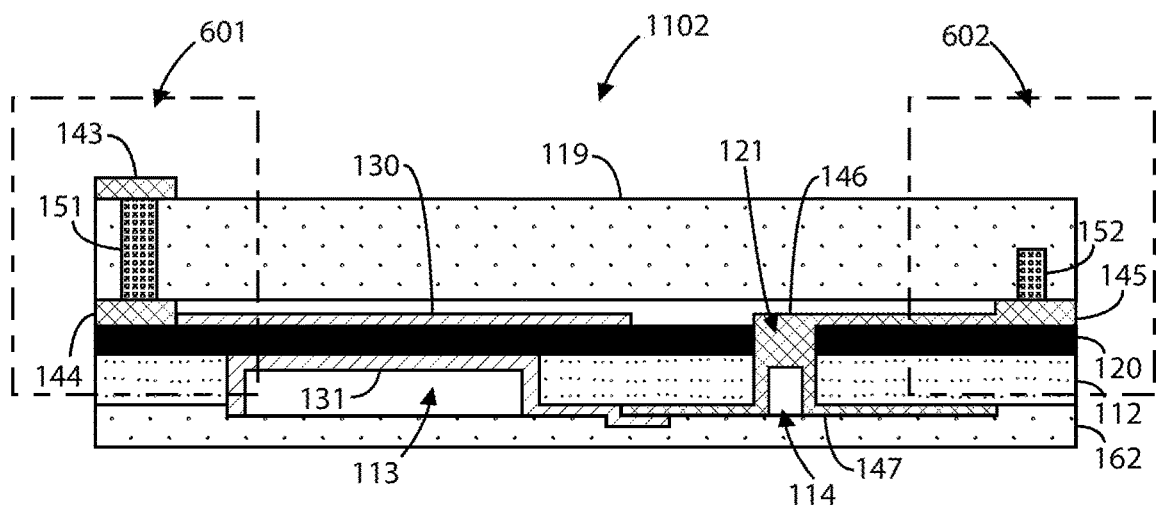

FIGS. 11A and 11B are simplified diagrams illustrating alternative steps for a method of manufacture for a single crystal electronic device according to an example of the present invention. These figures show methods of bonding a backside cap structure underlying the thinned seed substrate 112. In FIG. 11A, the backside cap structure is a dry film cap 161, which can include a permanent photo-imageable dry film such as a solder mask, polyimide, or the like. Bonding this cap structure can be cost-effective and reliable, but may not produce a hermetic seal. In FIG. 11B, the backside cap structure is a substrate 162, which can include a silicon, glass, or other like material. Bonding this substrate can provide a hermetic seal, but may cost more and require additional processes. Depending upon application, either of these backside cap structures can be bonded underlying the first and second backside vias.

Figure 12A:
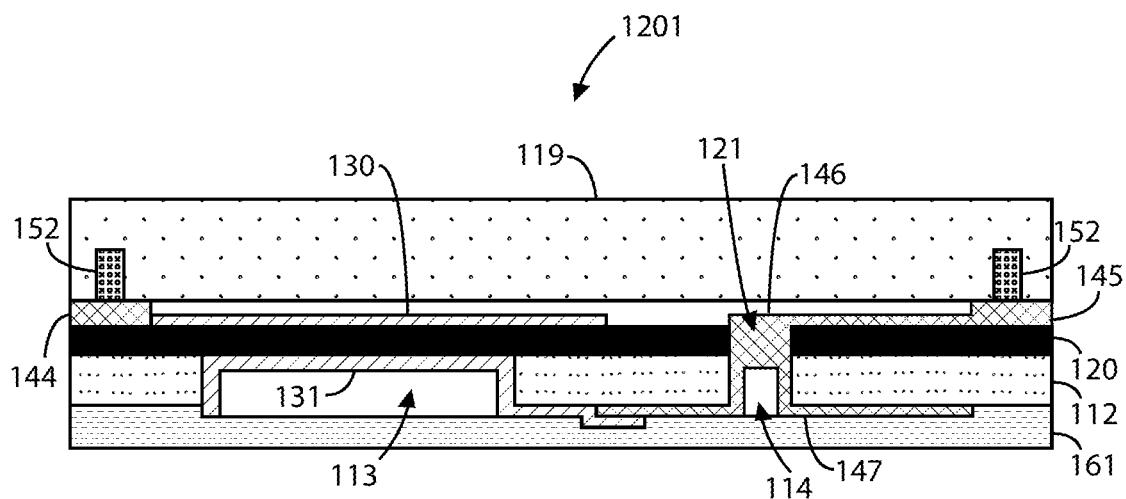
FIGS. 12A to 12E are simplified diagrams illustrating steps for a method of manufacture for a single crystal electronic device using a blind via interposer according to an example of the present invention.
Figure 12B:
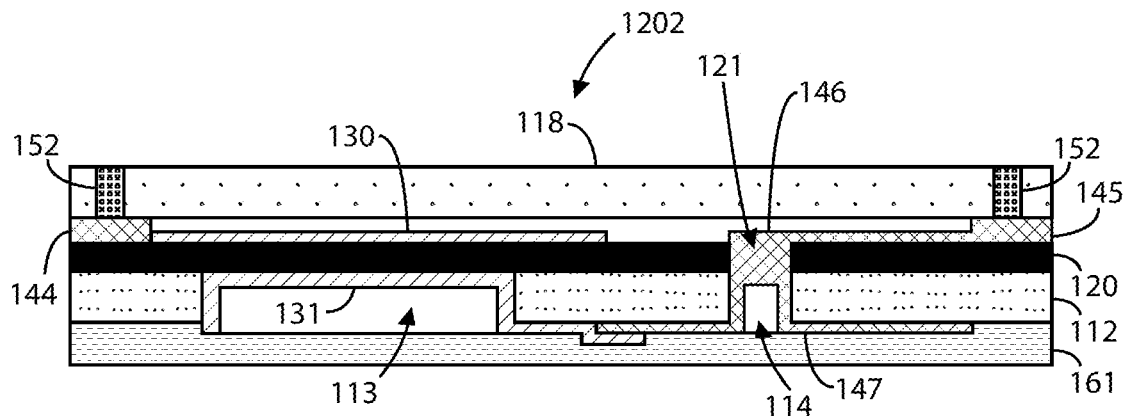
Figure 12C:
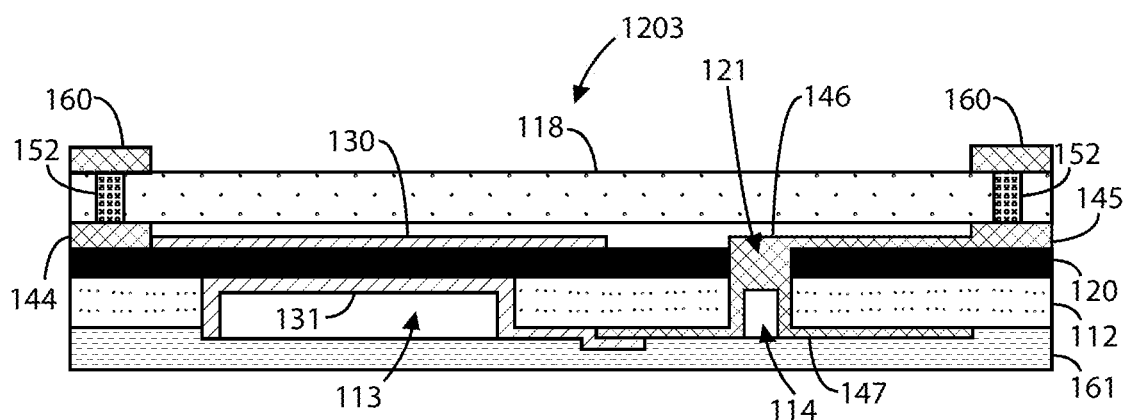
Figure 12D:
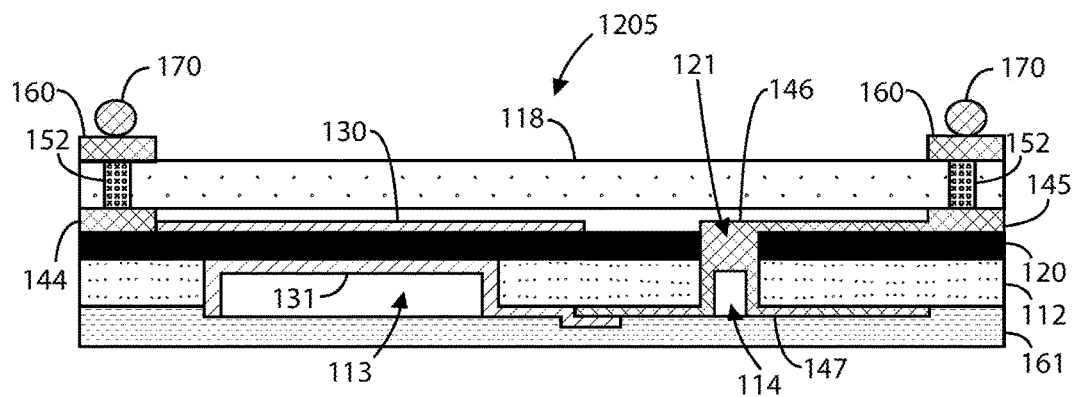
Figure 12E:
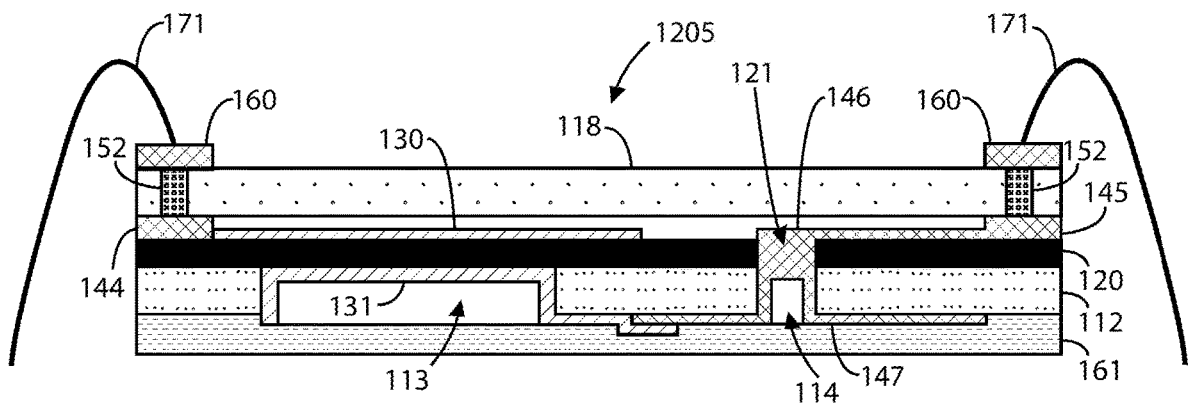

FIGS. 12A to 12E are simplified diagrams illustrating steps for a method of manufacture for a single crystal electronic device according to an example of the present invention. More specifically, these figures describe additional steps for processing the blind via interposer "602" version of the top cap structure. FIG. 12A shows a single crystal electronic device 1201 with blind vias 152 in the top cap structure. In FIG. 12B, the interposer substrate 119 is thinned, which forms a thinned interposer substrate 118, to expose the blind vias 152. This thinning process can be a combination of a grinding process and etching process as described for the thinning of the seed substrate. In FIG. 12C, a redistribution layer (RDL) process and metallization process can be applied to create top cap bond pads 160 that are formed overlying the blind vias 152 and are electrically coupled to the blind vias 152. As shown in FIG. 12D, a ball grid array (BGA) process can be applied to form solder balls 170 overlying and electrically coupled to the top cap bond pads 160. This process leaves the single crystal electronic device ready for wire bonding 171, as shown in FIG. 12E.

FIG. 13 is a simplified diagram illustrating a step for a method of manufacture for a single crystal electronic device according to an example of the present invention. As shown, device 1300 includes two fully processed single crystal devices that are ready to singulation to create separate devices. In an example, the die singulation process can be done using a wafer dicing saw process, a laser cut singulation process, or other processes and combinations thereof.

Figure 14A:
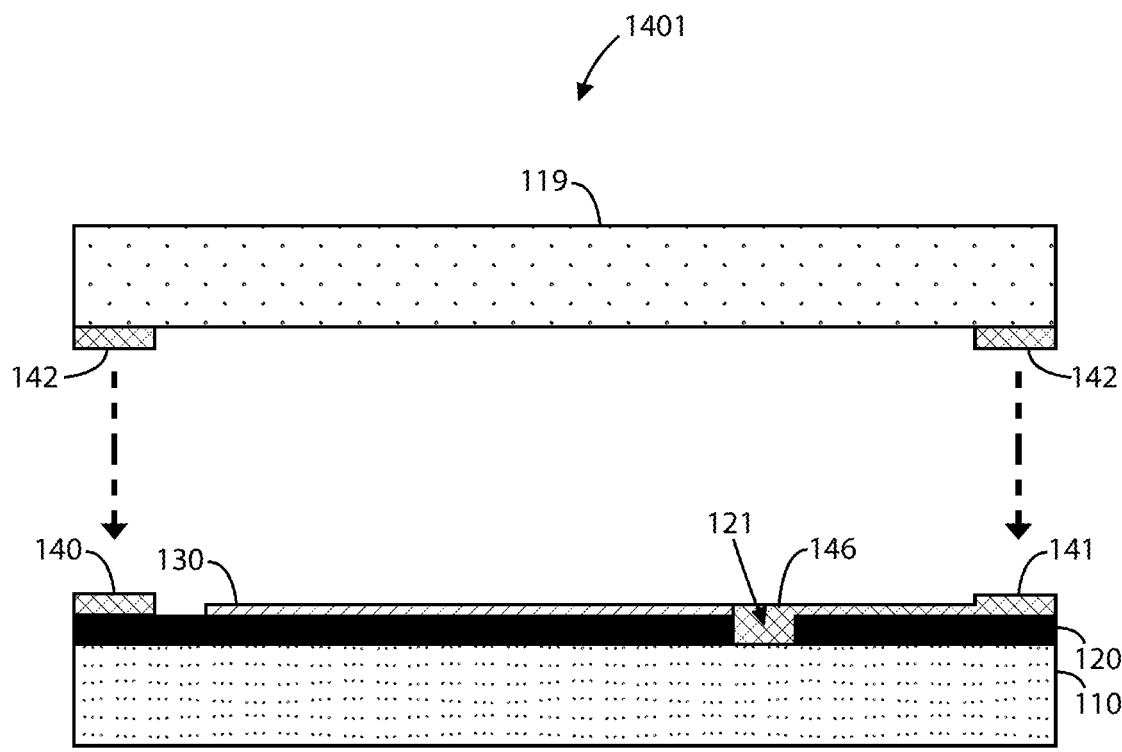
FIGS. 14A to 14G are simplified diagrams illustrating method steps for a cap wafer process for a single crystal electronic device according to an example of the present invention.

FIGS. 14A to 14G are simplified diagrams illustrating steps for a method of manufacture for a single crystal electronic device according to an example of the present invention. This method illustrates the process for fabricating a single crystal electronic device similar to that shown in FIG. 1B. The method for this example of a single crystal electronic device can go through similar steps as described in FIGS. 1-5. FIG. 14A shows where this method differs from that described previously. Here, the top cap structure substrate 119 and only includes one layer of metallization with one or more bottom bond pads 142. Compared to FIG. 6, there are no via structures in the top cap structure because the interconnections will be formed on the bottom side of the single crystal electronic device.

Figure 14B:
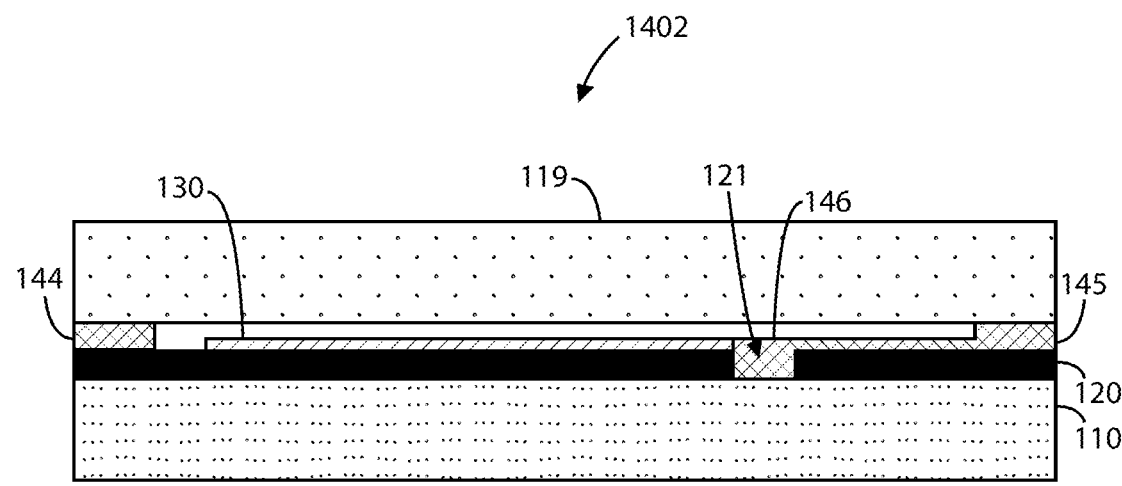
Figure 14C:
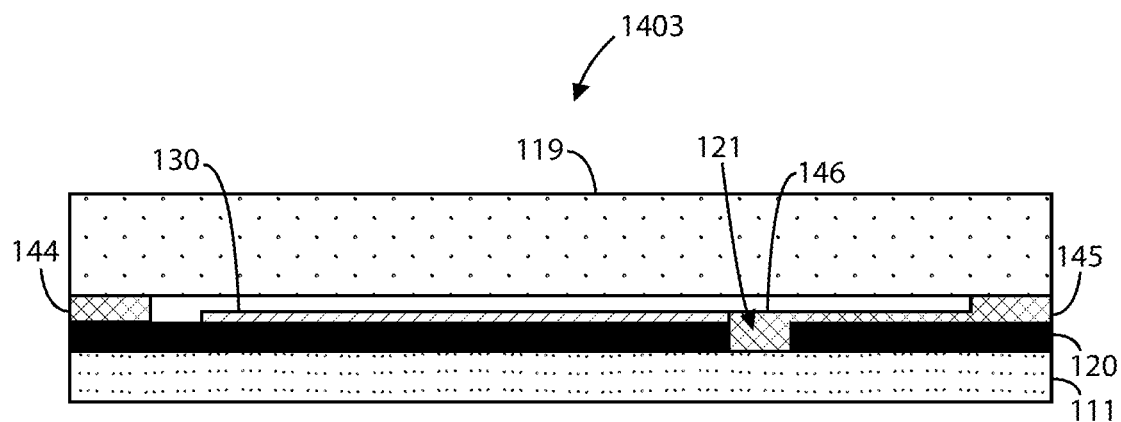
Figure 14D:
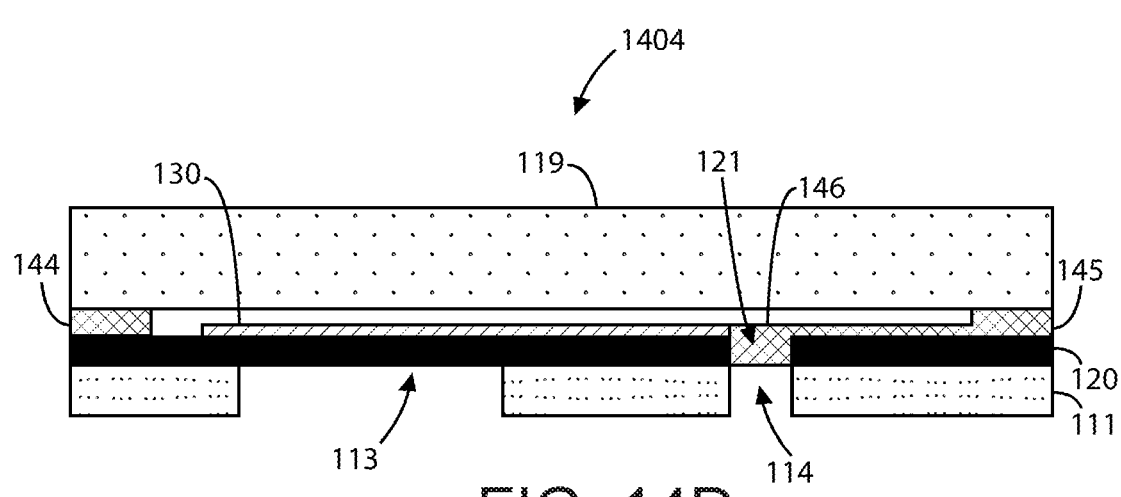
Figure 14E:
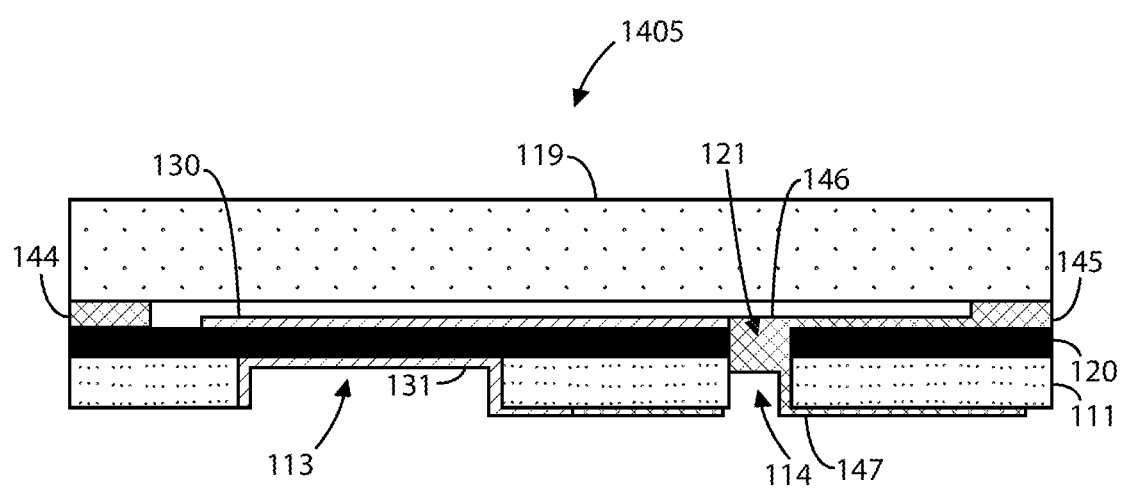
Figure 14F:
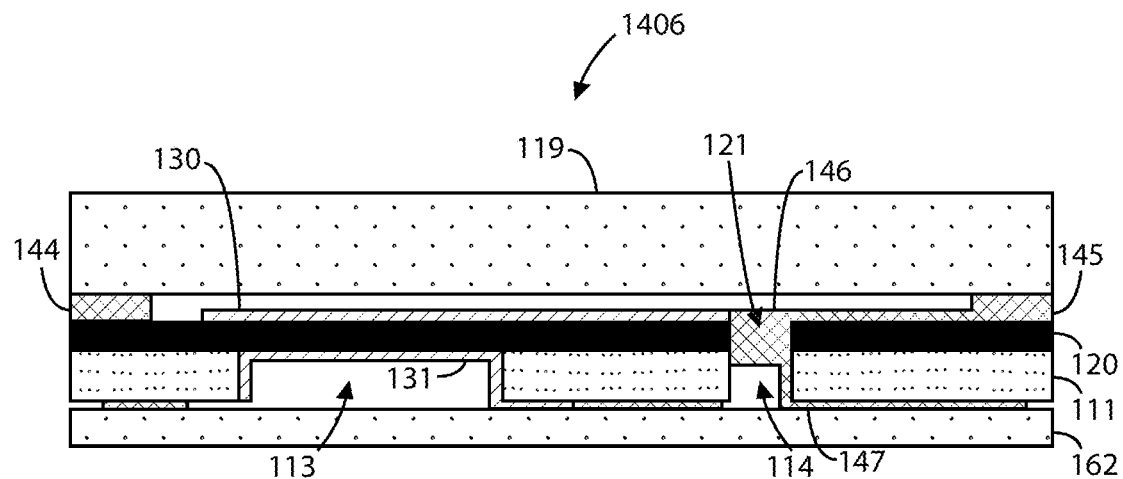

FIGS. 14B to 14F depict method steps similar to those described in the first process flow. FIG. 14B can represent a method step of bonding the top cap structure to the piezoelectric layer 120 through the bond pads (140, 142) and the topside metal 141, now denoted as bond pads 144 and topside metal 145 with topside metal plug 146. FIG. 14C can represent a method step of thinning the seed substrate 110, which forms a thinned seed substrate 111, similar to that described in FIG. 8. FIG. 14D can represent a method step of forming first and second backside trenches, similar to that described in FIG. 9A. FIG. 14E can represent a method step of forming a backside metal electrode 131 and a backside metal plug 147, similar to that described in FIG. 10. FIG. 14F can represent a method step of bonding a backside cap structure 162, similar to that described in FIGS. 11A and 11B.

Figure 14G:
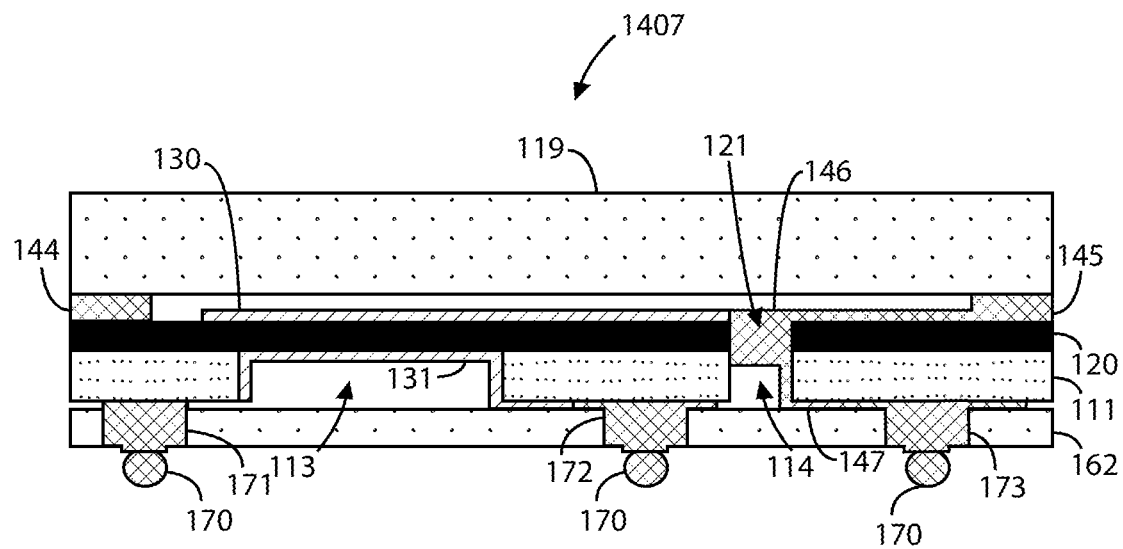

FIG. 14G shows another step that differs from the previously described process flow. Here, the backside bond pads 171, 172, and 173 are formed within the backside cap structure 162. In an example, these backside bond pads 171-173 can be formed through a masking, etching, and metal deposition processes similar to those used to form the other metal materials. A BGA process can be applied to form solder balls 170 in contact with these backside bond pads 171-173, which prepares the single crystal electronic device 1407 for wire bonding.

Figure 15A:
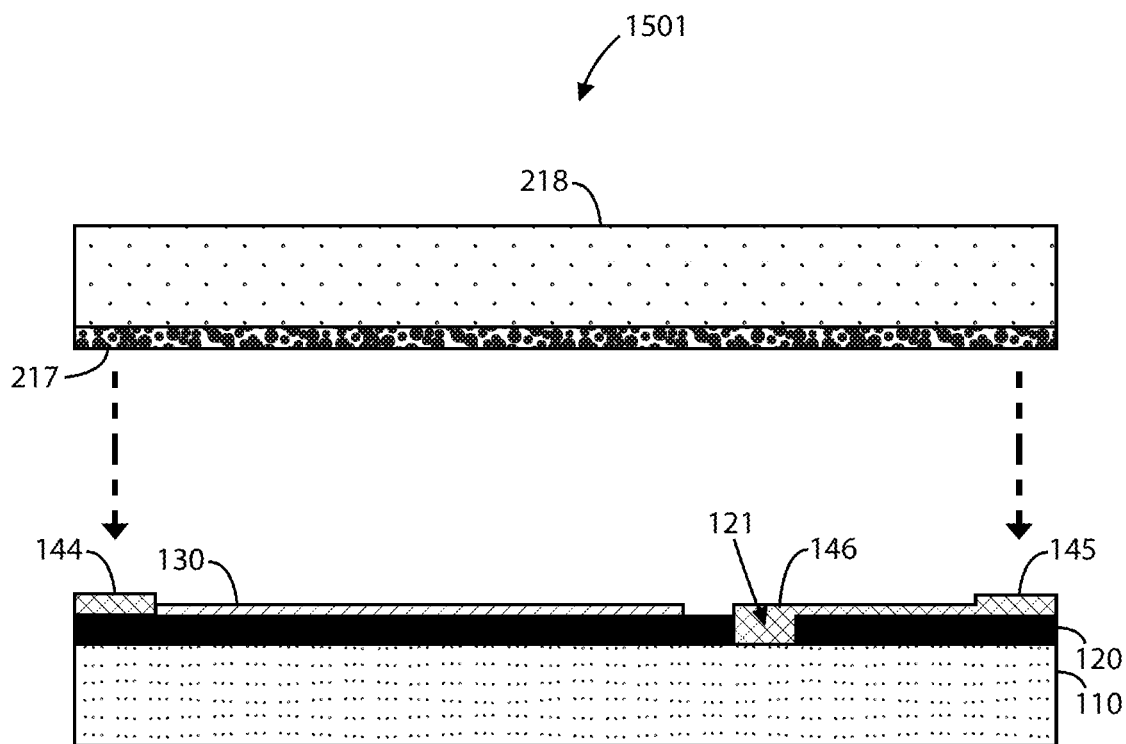
FIGS. 15A-15E are simplified diagrams illustrating method steps for making a single crystal electronic device with shared backside trench, which can be implemented in both interposer/cap and interposer free versions, according to examples of the present invention.

FIGS. 15A to 15E are simplified diagrams illustrating steps for a method of manufacture for a single crystal electronic device according to an example of the present invention. This method illustrates the process for fabricating a single crystal electronic device similar to that shown in FIG. 1B. The method for this example can go through similar steps as described in FIG. 1-5. FIG. 15A shows where this method differs from that described previously. A temporary carrier 218 with a layer of temporary adhesive 217 is attached to the substrate. In a specific example, the temporary carrier 218 can include a glass wafer, a silicon wafer, or other wafer and the like.

Figure 15B:
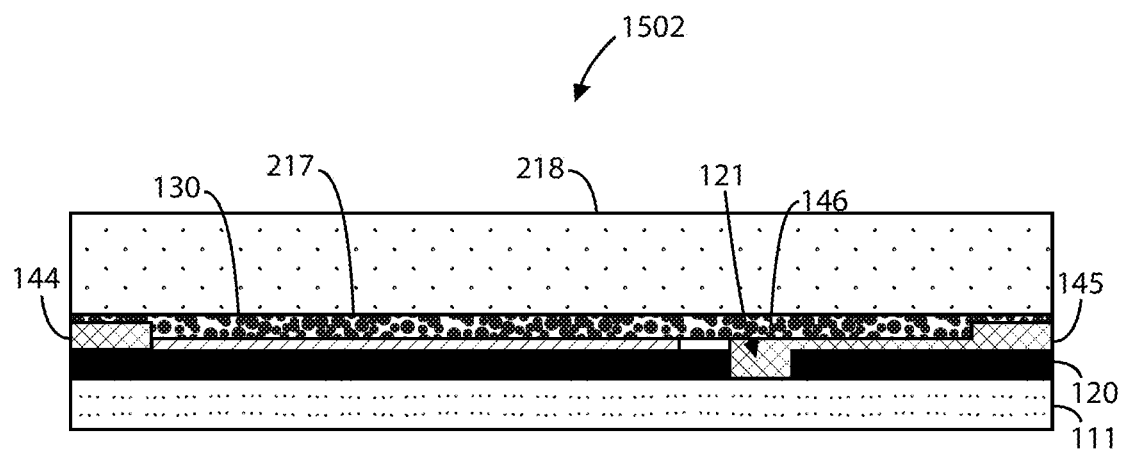

FIGS. 15B to 15F depict method steps similar to those described in the first process flow. FIG. 15B can represent a method step of thinning the seed substrate 110, which forms a thinned substrate 111, similar to that described in FIG. 8. In a specific example, the thinning of the seed substrate 110 can include a back side grinding process followed by a stress removal process. The stress removal process can include a dry etch, a Chemical Mechanical Planarization (CMP), and annealing processes.

Figure 15C:
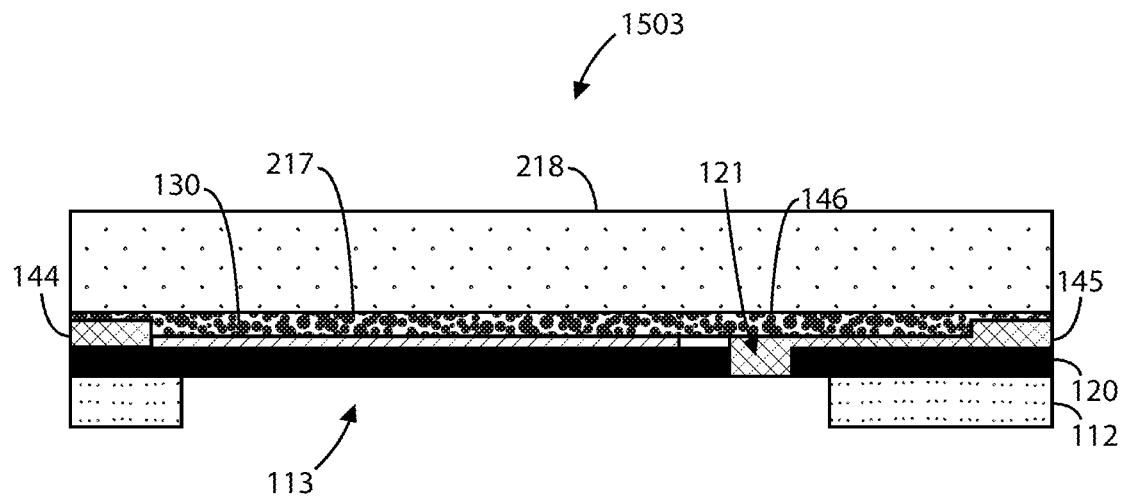

FIG. 15C can represent a method step of forming a shared backside trench 113, similar to the techniques described in FIG. 9A. The main difference is that the shared backside trench is configured underlying both topside metal electrode 130, topside micro-trench 121, and topside metal plug 146. In an example, the shared backside trench 113 is a backside resonator cavity that can vary in size, shape (all possible geometric shapes), and side wall profile (tapered convex, tapered concave, or right angle). In a specific example, the forming of the shared backside trench 113 can include a litho-etch process, which can include a back-to-front alignment and dry etch of the backside substrate 111. The piezoelectric layer 120 can serve as an etch stop layer for the forming of the shared backside trench 113.

Figure 15D:
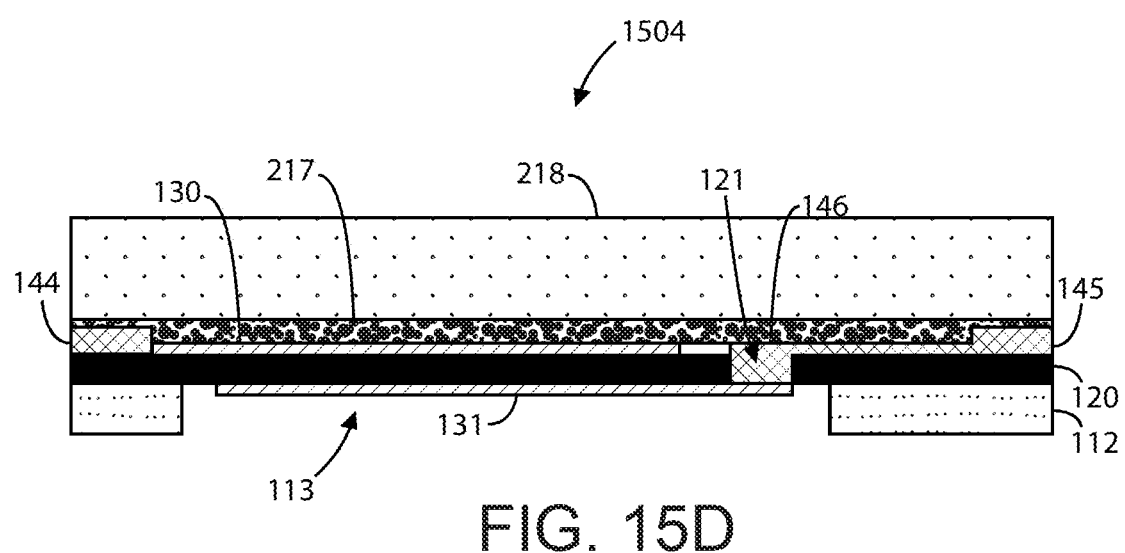

FIG. 15D can represent a method step of forming a backside metal electrode 131 and a backside metal 147, similar to that described in FIG. 10. In an example, the forming of the backside metal electrode 131 can include a deposition and patterning of metal materials within the shared backside trench 113. Here, the backside metal 131 serves as an electrode and the backside plug/connect metal 147 within the micro-via 121. The thickness, shape, and type of metal can vary as a function of the resonator/filter design. As an example, the backside electrode 131 and via plug metal 147 can be different metals. In a specific example, these backside metals 131, 147 can either be deposited and patterned on the surface of the piezoelectric layer 120 or rerouted to the backside of the substrate 112. In an example, the backside metal electrode may be patterned such that it is configured within the boundaries of the shared backside trench such that the backside metal electrode does not come in contact with one or more side-walls of the seed substrate created during the forming of the shared backside trench.

Figure 15E:
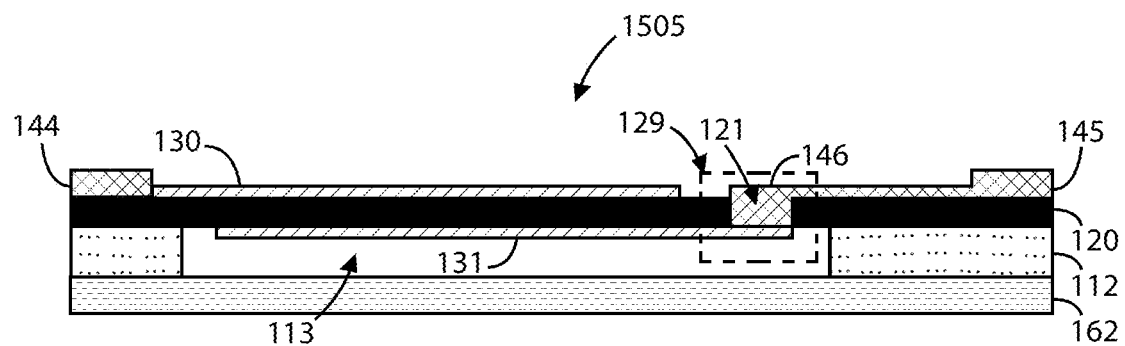

FIG. 15E can represent a method step of bonding a backside cap structure 162, similar to that described in FIGS. 11A and 11B, following a de-bonding of the temporary carrier 218 and cleaning of the topside of the device to remove the temporary adhesive 217. Those of ordinary skill in the art will recognize other variations, modifications, and alternatives of the methods steps described previously.

According to an example, the present invention includes a method for forming a piezoelectric layer to fabricate a single crystal electronic device. More specifically, the present method includes forming a single crystal material to be used to fabricate the single crystal electronic device. By modifying the strain state of the III-Nitride (III-N) crystal lattice, the present method can change the piezoelectric properties of the single crystal material to adjust the electronic properties of subsequent devices fabricated from this material. In a specific example, the method for forming the strained single crystal material can include modification of growth conditions of individual layers by employing one or a combination of the following parameters; gas phase reactant ratios, growth pressure, growth temperature, and introduction of impurities.

In an example, the single crystal material is grown epitaxially upon a substrate. Methods for growing the single crystal material can include metal-organic chemical vapor deposition (MOCVD), molecular beam epitaxy (MBE), hydride vapor phase epitaxy (HVPE), atomic layer deposition (ALD), or the like. Various process conditions can be selectively varied to change the piezoelectric properties of the single crystal material. These process conditions can include temperature, pressure, layer thickness, gas phase ratios, and the like. For example, the temperature conditions for films containing aluminum (Al) and gallium (Ga) and their alloys can range from about 800 to about 1500 degrees Celsius. The temperature conditions for films containing Al, Ga, and indium (In) and their alloys can range from about 600 to about 1000 degrees Celsius. In another example, the pressure conditions for films containing Al, Ga, and In and their alloys can range from about 1E-4 Torr to about 900 Torr.

Figure 16:
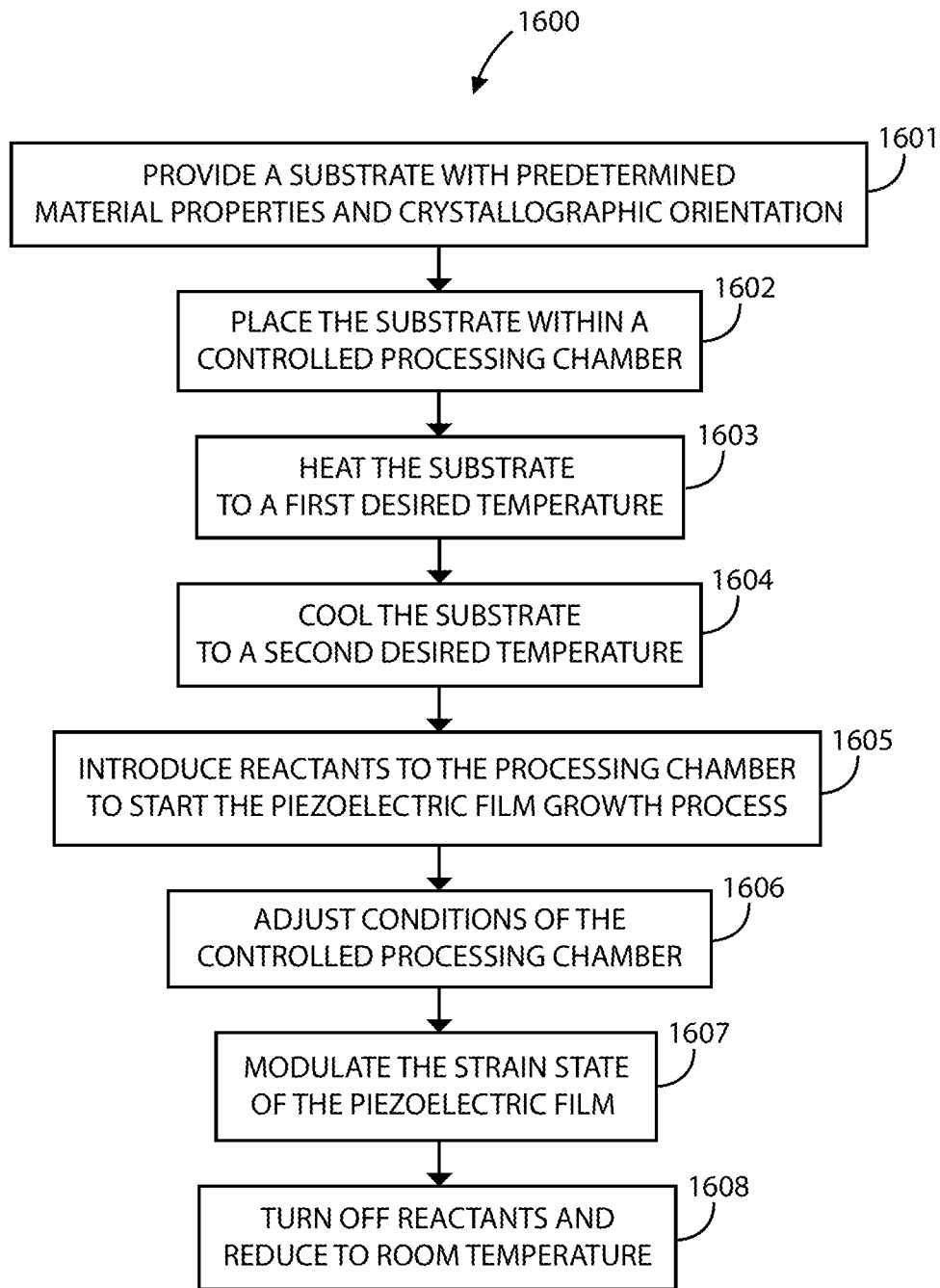
FIG. 16 is a simplified flow diagram illustrating a method for manufacturing a single crystal electronic device according to an example of the present invention.

FIG. 16 is a flow diagram illustrating a method for manufacturing a single crystal electronic device according to an example of the present invention. The following steps are merely examples and should not unduly limit the scope of the claims herein. One of ordinary skill in the art would recognize many other variations, modifications, and alternatives. For example, various steps outlined below may be added, removed, modified, rearranged, repeated, and/or overlapped, as contemplated within the scope of the invention. A typical growth process 1600 can be outlined as follows:

1601. Provide a substrate having the required material properties and crystallographic orientation. Various substrates can be used in the present method for fabricating single crystal electronic device such as Silicon, Sapphire, Silicon Carbide, Gallium Nitride (GaN) or Aluminum Nitride (AlN) bulk substrates. The present method can also use GaN templates, AlN templates, and $Al_xGa_{1-x}N$ templates (where x varies between 0.0 and 1.0). These substrates and templates can have polar, non-polar, or semi-polar crystallographic orientations. Those of ordinary skill in the art will recognize other variations, modifications, and alternatives;

1602. Place the selected substrate into a processing chamber within a controlled environment;

1603. Heat the substrate to a first desired temperature. At a reduced pressure between 5-800 mbar the substrates are heated to a temperature in the range of 1100°-1350° C. in the presence of purified hydrogen gas as a means to clean the exposed surface of the substrate. The purified hydrogen flow shall be in the range of 5-30 slpm (standard liter per minute) and the purity of the gas should exceed 99.9995%;

1604. Cool the substrate to a second desired temperature. After 10-15 minutes at elevated temperature, the substrate surface temperature should be reduced by 100-200° C.; the temperature offset here is determined by the selection of substrate material and the initial layer to be grown (Highlighted in FIGS. 18A-C);

1605. Introduce reactants to the processing chamber. After the temperature has stabilized the Group III and Group V reactants are introduced to the processing chamber and growth is initiated.

1606. Upon completion of the nucleation layer the growth chamber pressures, temperatures, and gas phase mixtures may be further adjusted to grow the layer or plurality of layers of interest for the single crystal electronic device.

1607. During the film growth process the strain-state of the material may be modulated via the modification of growth conditions or by the controlled introduction of impurities into the film (as opposed to the modification of the electrical properties of the film).

1608. At the conclusion of the growth process the Group III reactants are turned off and the temperature resulting film or films are controllably lowered to room. The rate of thermal change is dependent upon the layer or plurality of layers grown and in the preferred embodiment is balanced such that the physical parameters of the substrate including films are suitable for subsequent processing.

Referring to step 1605, the growth of the single crystal material can be initiated on a substrate through one of several growth methods: direct growth upon a nucleation layer, growth upon a super lattice nucleation layer, and growth upon a graded transition nucleation layer. The growth of the single crystal material can be homoepitaxial, heteroepitaxial, or the like. In the homoepitaxial method, there is a minimal lattice mismatch between the substrate and the films such as the case for a native III-N single crystal substrate material. In the heteroepitaxial method, there is a variable lattice mismatch between substrate and film based on in-plane lattice parameters. As further described below, the combinations of layers in the nucleation layer can be used to engineer strain in the subsequently formed structure.

Referring to step 1606, various substrates can be used in the present method for fabricating a single crystal electronic device. Silicon substrates of various crystallographic orientations may be used. Additionally, the present method can use sapphire substrates, silicon carbide substrates, gallium nitride (GaN) bulk substrates, or aluminum nitride (AlN) bulk substrates. The present method can also use GaN templates, AlN templates, and $Al_xGa_{1-x}N$ templates (where x varies between 0.0 and 1.0). These substrates and templates can have polar, non-polar, or semi-polar crystallographic orientations. Those of ordinary skill in the art will recognize other variations, modifications, and alternatives.

In an example, the present method involves controlling material characteristics of the nucleation and piezoelectric layer(s). In a specific example, these layers can include single crystal materials that are configured with defect densities of less than 1E+11 defects per square centimeter. The single crystal materials can include alloys selected from at least one of the following: AlN, AlGaN, GaN, InN, InGaN, AlInN, AlInGaN, and BN. In various examples, any single or combination of the aforementioned materials can be used for the nucleation layer(s) and/or the piezoelectric layer(s) of the device structure.

According to an example, the present method involves strain engineering via growth parameter modification. More specifically, the method involves changing the piezoelectric properties of the epitaxial films in the piezoelectric layer via modification of the film growth conditions (these modifications can be measured and compared via the sound velocity of the piezoelectric films). These growth conditions can include nucleation conditions and piezoelectric layer conditions. The nucleation conditions can include temperature, thickness, growth rate, gas phase ratio (V/III), and the like. The piezo electric layer conditions can include transition conditions from the nucleation layer, growth temperature, layer thickness, growth rate, gas phase ratio (V/III), post growth annealing, and the like. Further details of the present method can be found below.

Figure 17:
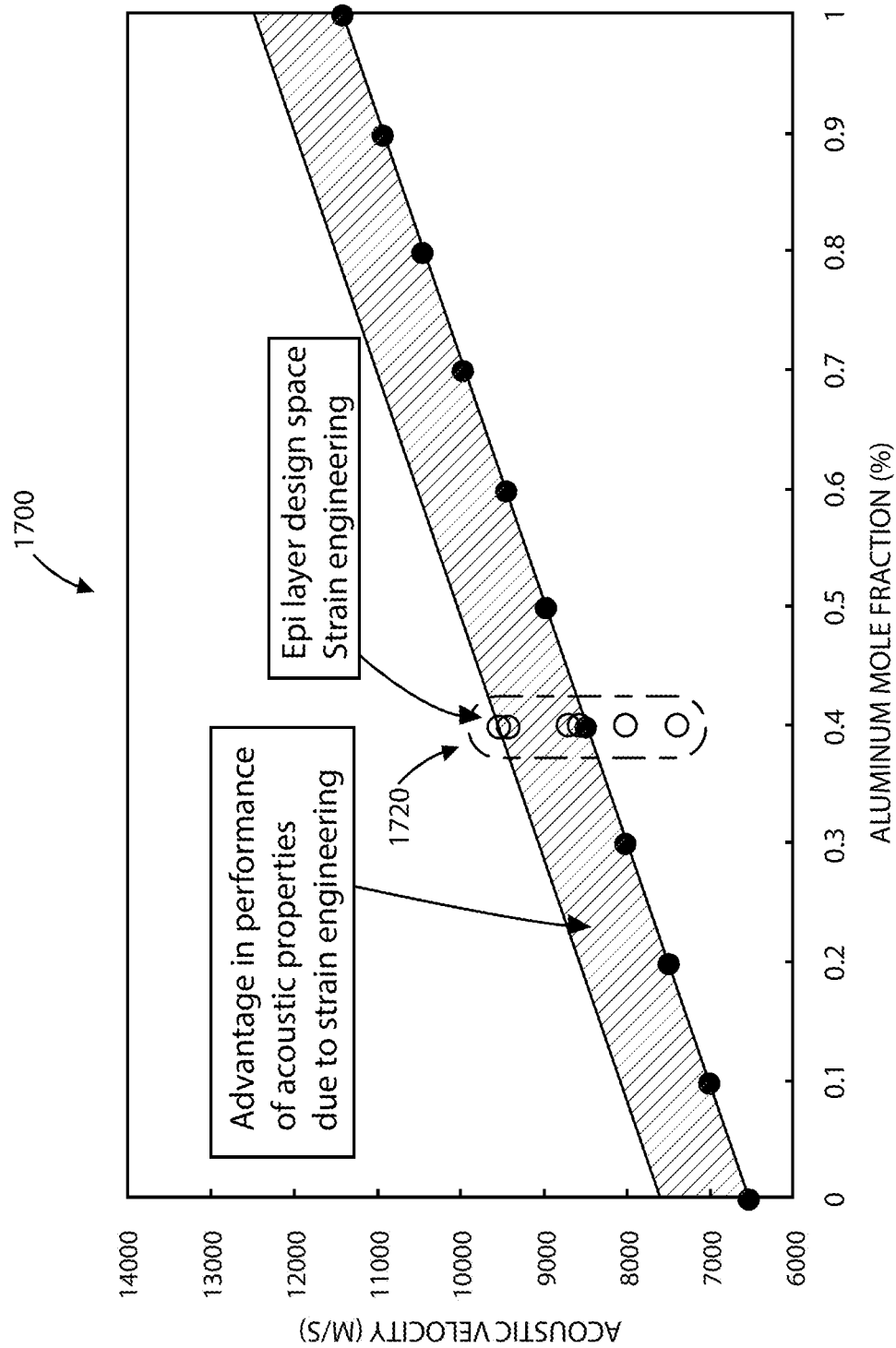
FIG. 17 is a simplified graph illustrating the results of forming a piezoelectric layer for a single crystal electronic device according to an example of the present invention. The graph highlights the ability of to tailor the piezoelectric properties of the material for a given Aluminum mole fraction. Such flexibility allows for the resulting resonator properties to be tailored to the individual application.

FIG. 17 is a simplified graph illustrating the results of forming a piezoelectric layer for a single crystal electronic device according to an example of the present invention. This graph highlights the ability of to tailor the electronic properties of the material for a given Aluminum mole fraction. Referring to step 1607 above, such flexibility allows for the resulting resonator properties to be tailored to the individual application. As shown, graph 1700 depicts a plot of acoustic velocity (m/s) over aluminum mole fraction (%). The marked region 1720 shows the modulation of acoustic velocity via strain engineering of the piezo electric layer at an aluminum mole fraction of 0.4. Here, the data shows that the change in acoustic velocity ranges from about 7,500 m/s to about 9,500 m/s, which is about ±1,000 m/s around the initial acoustic velocity of 8,500 m/s. Thus, the modification of the growth parameters provides a large tunable range for acoustic velocity of the single crystal electronic device. This tunable range will be present for all aluminum mole fractions from 0 to 1.0 and is a degree of freedom not present in other conventional embodiments of this technology As described previously, Scandium incorporation generates a local distortion in the crystal lattice because Scandium has a larger atomic radius than the Al atoms. The Scandium source used for impurity incorporation may be a solid or gaseous state, pure, or compound derived. This incorporation changes the interatomic spacing in the lattice and generates additional strain. More particularly, when the strain is aligned in the same crystallographic direction (e.g., in monolithic single crystal thin films) the piezoelectric properties of the film can be modified and optimized for specific applications. For example, such strain modification for passive devices can enhance phonon velocity to improve coupling efficiency ($k^2$) of elements. For active devices, strain modification can enhance the strain at bi-layer interfaces to improve density of changes present in two-dimensional (2D) and three-dimensional (3D) electron gases. Those of ordinary skill in the art will recognize other variations, modifications, and alternatives.

The present method also includes strain engineering by impurity introduction, or doping, to impact the rate at which a sound wave will propagate through the material. Referring to step 1607 above, impurities can be specifically introduced to enhance the rate at which a sound wave will propagate through the material. In an example, the impurity species can include, but is not limited to, the following: silicon (Si), magnesium (Mg), carbon (C), oxygen (O), erbium (Er), rubidium (Rb), strontium (Sr), scandium (Sc), beryllium (Be), molybdenum (Mo), zirconium (Zr), Hafnium (Hf), and vanadium (Va). Silicon, magnesium, carbon, and oxygen are common impurities used in the growth process, the concentrations of which can be varied for different piezoelectric properties. In a specific example, the impurity concentration ranges from about 1E+15 to about 1E+21 per cubic centimeter. The impurity source used to deliver the impurities to can be a source gas, which can be delivered directly, after being derived from an organometallic source, or through other like processes.

The present method also includes strain engineering by the introduction of alloying elements, to impact the rate at which a sound wave will propagate through the material. Referring to step 1607 above, alloying elements can be specifically introduced to enhance the rate at which a sound wave will propagate through the material. In an example, the alloying elements can include, but are not limited to, the following: magnesium (Mg), erbium (Er), rubidium (Rb), strontium (Sr), scandium (Sc), titanium (Ti), zirconium (Zr), Hafnium (Hf), vanadium (Va), Niobium (Nb), and tantalum (Ta). In a specific embodiment, the alloying element (ternary alloys) or elements (in the case of quaternary alloys) concentration ranges from about 0.01% to about 50%. Similar to the above, the alloy source used to deliver the alloying elements can be a source gas, which can be delivered directly, after being derived from an organometallic source, or through other like processes. Those of ordinary skill in the art will recognize other variations, modifications, and alternatives to these processes.

The methods for introducing impurities can be during film growth (in-situ) or post growth (ex-situ). During film growth, the methods for impurity introduction can include bulk doping, delta doping, co-doping, and the like. For bulk doping, a flow process can be used to create a uniform dopant incorporation. For delta doping, flow processes can be intentionally manipulated for localized areas of higher dopant incorporation. For co-doping, the any doping methods can be used to simultaneously introduce more than one dopant species during the film growth process. Following film growth, the methods for impurity introduction can include ion implantation, chemical treatment, surface modification, diffusion, co-doping, or the like. The of ordinary skill in the art will recognize other variations, modifications, and alternatives.

Figure 18A:
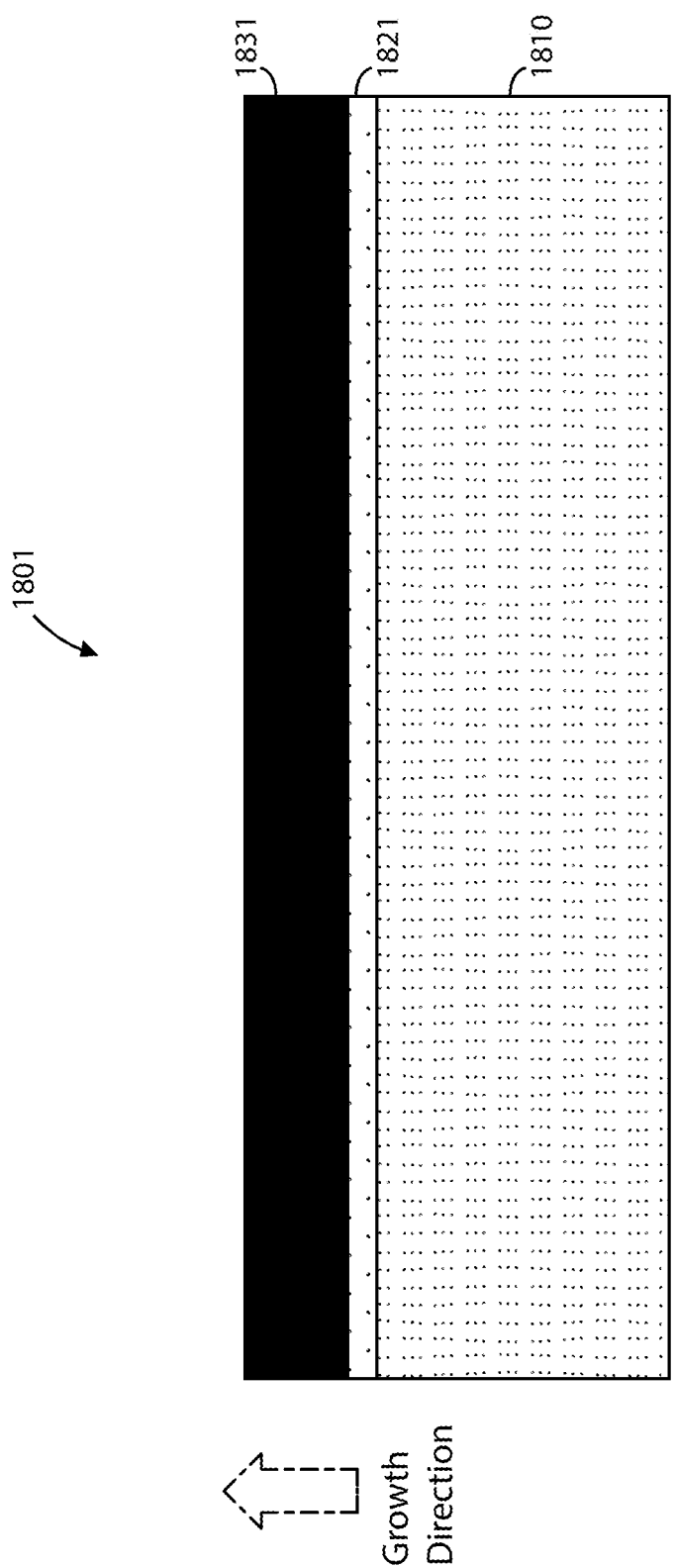
FIG. 18A is a simplified diagram illustrating a method for forming a piezoelectric layer for a single crystal electronic device according to an example of the present invention.

FIG. 18A is a simplified diagram illustrating a method for forming a piezoelectric layer for a single crystal electronic device according to an example of the present invention. As shown in device 1801, the piezoelectric layer 1831, or film, is directly grown on the nucleation layer 1821, which is formed overlying a surface region of a substrate 1810. The nucleation layer 1821 may be the same or different atomic composition as the piezoelectric layer 1831. Here, the piezoelectric film 1831 may be doped by one or more species during the growth (in-situ) or post-growth (ex-situ) as described previously.

Figure 18B:
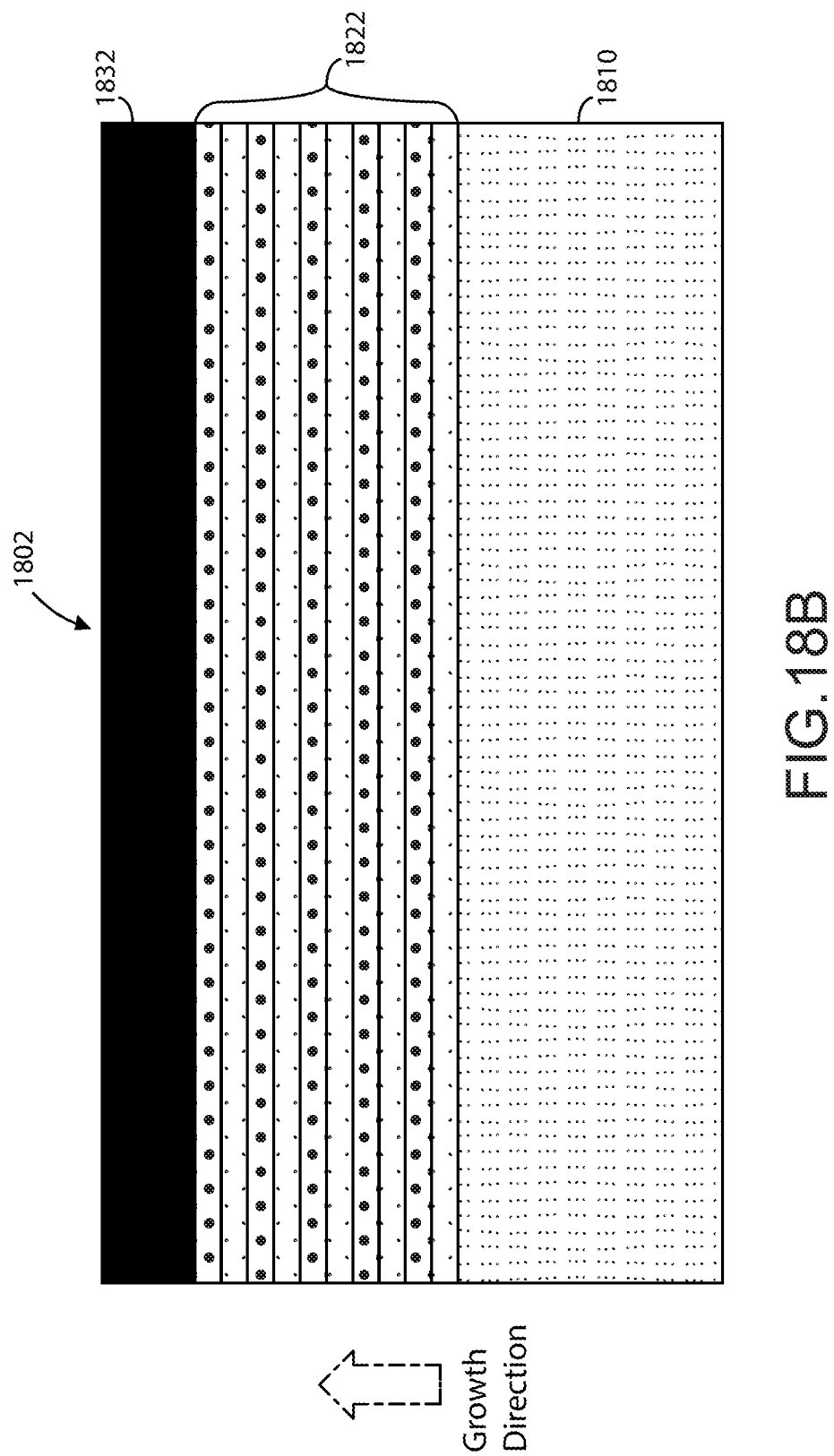
FIG. 18B is a simplified diagram illustrating a method for forming a piezoelectric layer for a single crystal electronic device according to an example of the present invention.

FIG. 18B is a simplified diagram illustrating a method for forming a piezoelectric layer for a single crystal electronic device according to an example of the present invention. As shown in device 1802, the piezoelectric layer 1832, or film, is grown on a super lattice nucleation layer 1822, which is comprised of layer with alternating composition and thickness. This super lattice layer 1822 is formed overlying a surface region of the substrate 1810. The strain of device 1802 can be tailored by the number of periods, or alternating pairs, in the super lattice layer 1822 or by changing the atomic composition of the constituent layers. Similarly, the piezoelectric film 1832 may be doped by one or more species during the growth (in-situ) or post-growth (ex-situ) as described previously.

Figure 18C:
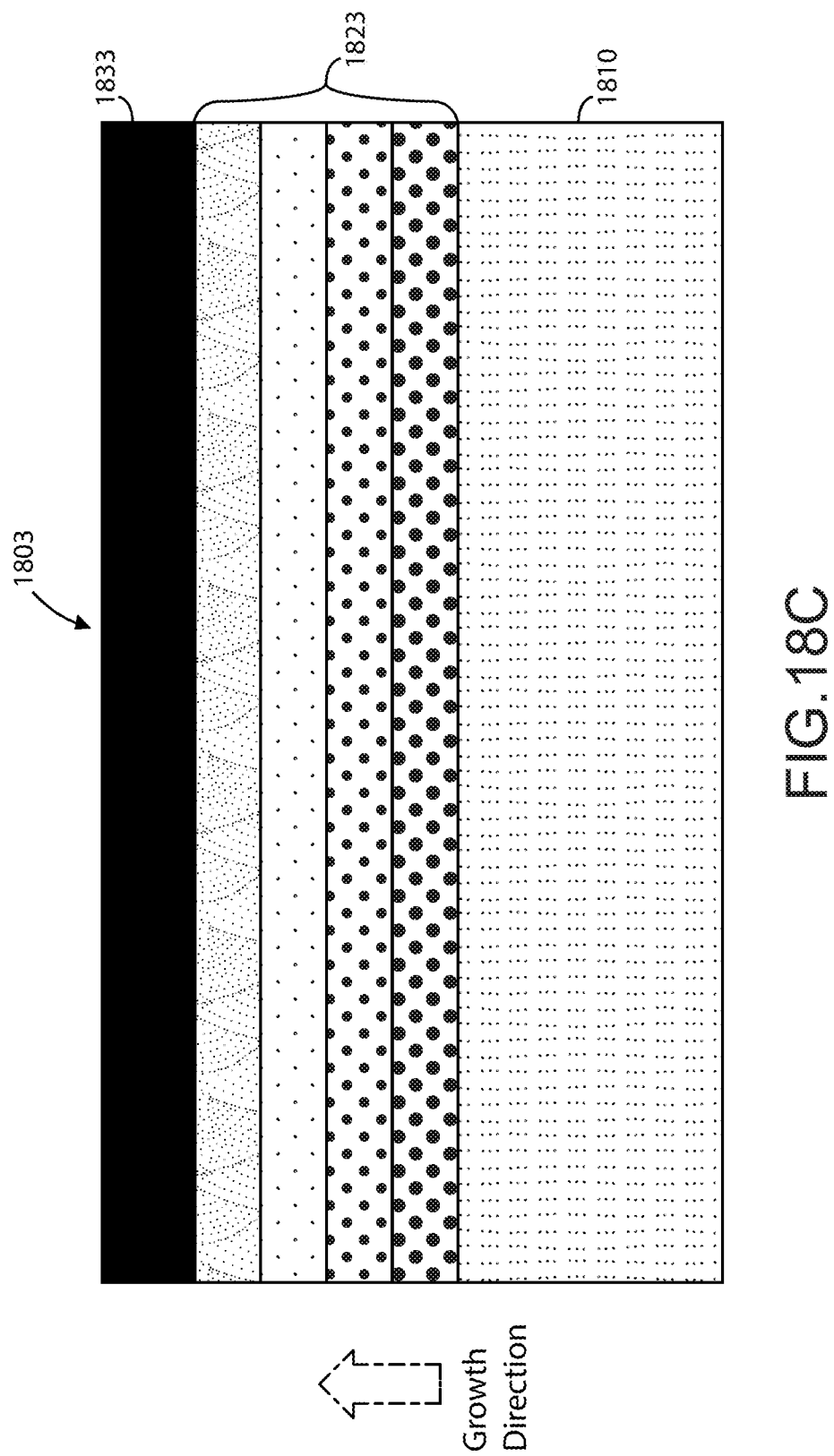
FIG. 18C is a simplified diagram illustrating a method for forming a piezoelectric layer for a single crystal electronic device according to an example of the present invention.

FIG. 18C is a simplified diagram illustrating a method for forming a piezoelectric layer for a single crystal electronic device according to an example of the present invention. As shown in device 1803, the piezoelectric layer 1833, or film, is grown on graded transition layers 1823. These transition layers 1823, which are formed overlying a surface region of the substrate 1810, can be used to tailor the strain of device 1803. In an example, the alloy (binary or ternary) content can be decreased as a function of growth in the growth direction. This function may be linear, step-wise, or continuous. Similarly, the piezoelectric film 1833 may be doped by one or more species during the growth (in-situ) or post-growth (ex-situ) as described previously.

Figure 18D:
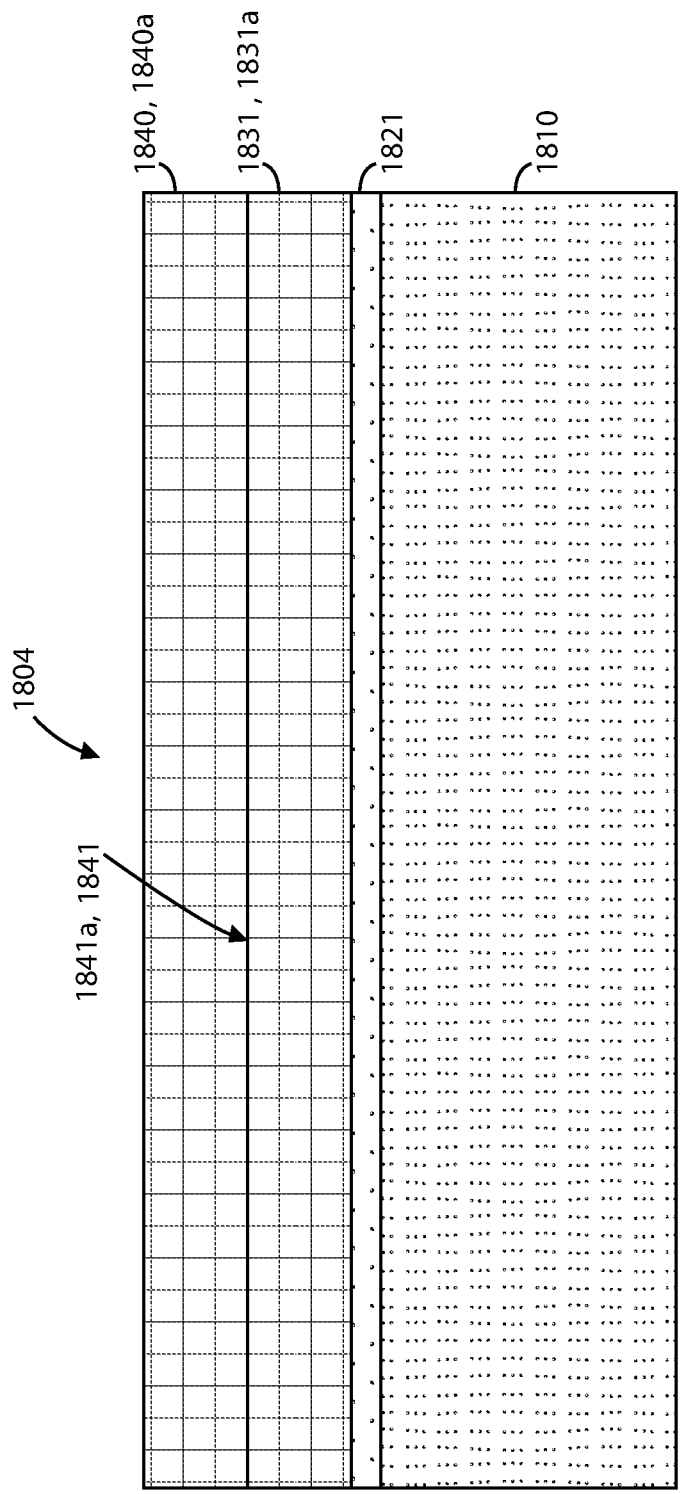
FIG. 18D is a simplified diagram illustrating a method for forming a piezoelectric layer for a single crystal electronic device according to an example of the present invention.

FIG. 18D is a simplified diagram illustrating a method for forming a piezoelectric layer for a single crystal electronic device according to an example of the present invention. Device 1804 can be an example of an active device structure having a first and second piezoelectric layers 1831, 1840. Similar to device 1801, the piezoelectric layer 1831, or film, is directly grown on the nucleation layer 1821, which is formed overlying a surface region of a substrate 1810. The nucleation layer 1821 may be the same or different atomic composition as the piezoelectric layer 1831. Also, the piezoelectric film 1831, 1840 may be doped by one or more species during the growth (in-situ) or post-growth (ex-situ) as described previously. The second layer 1840 can be formed overlying the first layer 1831, and the electronic properties at the interface 1841 between the two layers can be enhanced by incorporation of impurities, such as Scandium and others described previously, which results in improved device metrics.

In an example, the present invention provides a method for manufacturing a single crystal electronic device. As described previously, the method can include a piezoelectric film growth process such as a direct growth upon a nucleation layer, growth upon a super lattice nucleation layer, or a growth upon graded transition nucleation layers. Each process can use nucleation layers that include, but are not limited to, materials or alloys having at least one of the following: AlN, AlGaN, GaN, InN, InGaN, AlInN, AlInGaN, and BN. Those of ordinary skill in the art will recognize other variations, modifications, and alternatives.

Figure 19:
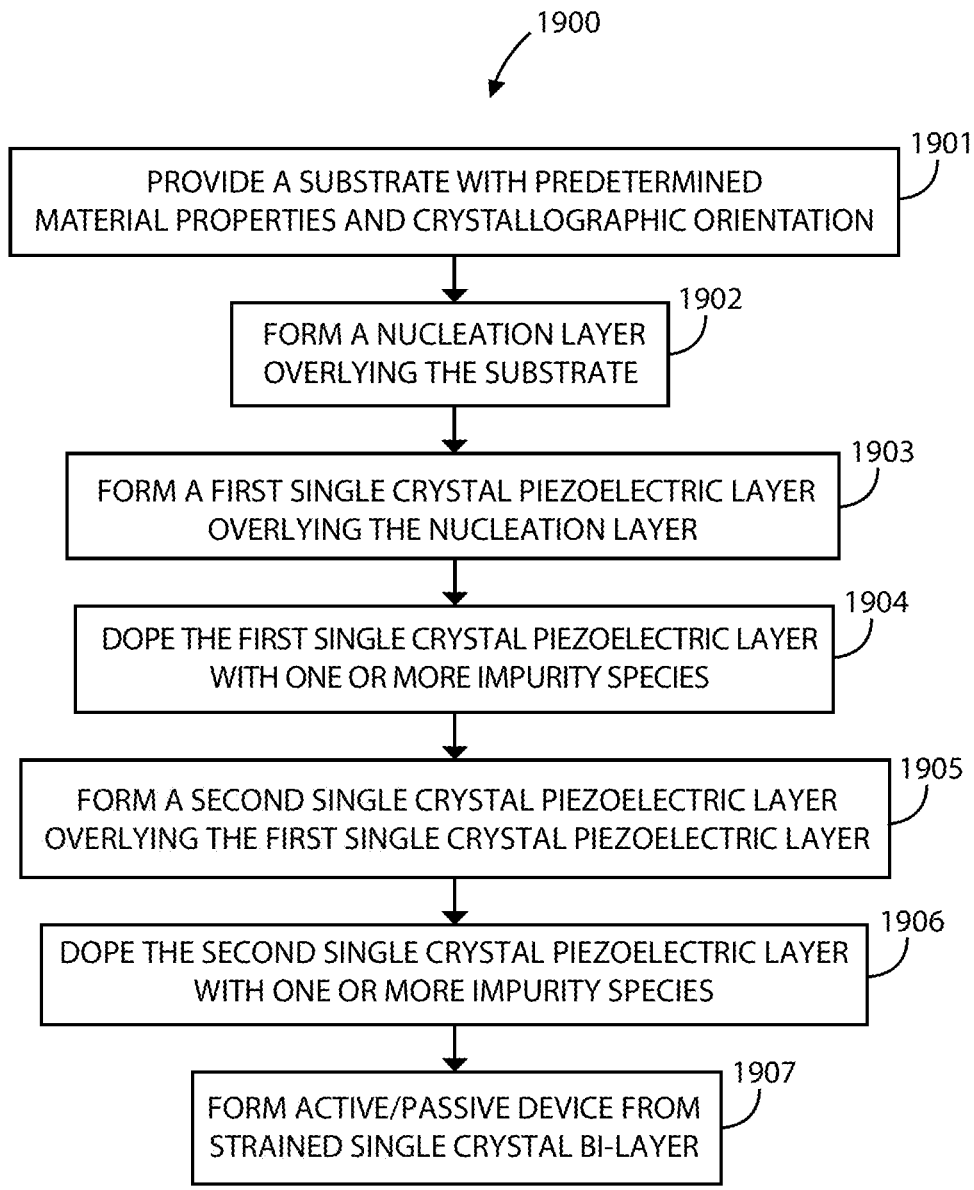
FIG. 19 is a simplified flow diagram illustrating a method for manufacturing a single crystal electronic device according to an example of the present invention.

FIG. 19 is a flow diagram illustrating a method for manufacturing a single crystal electronic device according to an example of the present invention. The following steps are merely examples and should not unduly limit the scope of the claims herein. One of ordinary skill in the art would recognize many other variations, modifications, and alternatives. For example, various steps outlined below may be added, removed, modified, rearranged, repeated, and/or overlapped, as contemplated within the scope of the invention. A typical growth process 1900 can be outlined as follows:

1901. Provide a substrate 1810 having the required material properties and crystallographic orientation. Various substrates can be used in the present method for fabricating single crystal electronic device such as Silicon, Sapphire, Silicon Carbide, Gallium Nitride (GaN) or Aluminum Nitride (AlN) bulk substrates. The present method can also use GaN templates, AlN templates, and AlxGa1-xN templates (where x varies between 0.0 and 1.0). These substrates and templates can have polar, non-polar, or semi-polar crystallographic orientations. Those of ordinary skill in the art will recognize other variations, modifications, and alternatives;

1902. Form a nucleation layer 1821 overlying the substrate surface region and being characterized by nucleation growth parameters;

1903. Form a first single crystal layer 1831 overlying the substrate surface region;

1904. Dope the first single crystal piezoelectric layer by introducing one or more impurity species to form a first strained single crystal piezoelectric layer 1831*a*, wherein the first strained single crystal piezoelectric layer is characterized by a first strain condition and first piezoelectric layer parameters;

1905. Form a second single crystal piezoelectric layer 1840 overlying the first single crystal piezoelectric layer;

1906. Dope the second single crystal piezoelectric layer by introducing one or more impurity species to form a second strained single crystal piezoelectric layer 1840*a*; wherein the second strained crystal piezoelectric layer is characterized by a second strain condition and second piezoelectric layer parameters; and wherein the first and second strained single crystal piezoelectric layers form a strained single crystal bi-layer having an interface region 1841; and 1907. Form an active or passive device from the strained single crystal bi-layer; such active devices can include but not are limited to transistors, switches, high power amplifiers, low noise amplifiers, and the like; such passive devices can include but are not limited to surface and bulk acoustic resonator and filter based devices.

In a specific embodiment, the forming of the first and second strained single crystal piezoelectric layers can include forming the layers such that the first strain condition of the first layer and the second strain condition of the second layer are aligned 1841a in the same crystallographic direction at the interface region 1841 of the resulting strained single crystal bi-layer. This method can be applied to multiple layers to form multiple enhanced interface regions between strained single crystal layers.

In a specific example, the strained single crystal bi-layer can be used to form a passive device, such as a resonator or RF filter. The strain in such devices can improve phonon velocity, which leads to improved electromechanical coupling (k2) of the resonator/filter element. In another specific example, the strained single crystal bi-layer can be used to form an active device element, such as transistors and amplifiers. The strain in such devices can improve the density of electric charge present at the interface, which will enhance the sheet charge density of the heterojunction and the corresponding carrier mobility. Those of ordinary skill in the art will recognize other variations, modifications, and alternatives.

One or more benefits are achieved over pre-existing techniques using the invention. In particular, the present device can be manufactured in a relatively simple and cost effective manner while using conventional materials and/or methods according to one of ordinary skill in the art. Using the present methods, one can create a reliable single crystal thin film electronic device using multiple ways of three-dimensional stacking through a wafer level process. Such methods provide the ability to selectively vary the concentration and properties of the impurities introduced into single crystal materials, e.g., III-N materials, which provide for improved device characteristics. These methods can be applied to devices such as sensors, actuators, power sources, motors, and the like. Depending upon the embodiment, one or more of these benefits may be achieved.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as an aluminum, gallium, or ternary compound of aluminum and gallium and nitrogen containing epitaxial region, or functional regions, combinations, and the like. Therefore, the above description and illustrations should not be taken as limiting the scope of the present invention which is defined by the appended claims.

What is claimed is:

1. A method for fabricating a single crystal electronic device, the method comprising:
   providing a substrate having a substrate surface region;
   forming a nucleation layer overlying the substrate surface region;
   forming a first single crystal piezoelectric layer overlying the nucleation layer;
   forming a first strained single crystal piezoelectric layer having a first strain condition with additional strain by doping the first single crystal piezoelectric layer with one or more impurity species including scandium (Sc) such that the first strain condition of the first strained single crystal piezoelectric layer has additional strain, when compared to the first single crystal piezoelectric layer, the additional strain of the first strain condition having a crystallographic direction;
   forming a second single crystal piezoelectric layer having a second crystal lattice overlying the first single crystal piezoelectric layer; and
   forming a second strained single crystal piezoelectric layer having a second strain condition with additional strain by doping the second single crystal piezoelectric layer with one or more impurity species including scandium (Sc) such that the second strain condition has additional strain, when compared to the second single crystal piezoelectric layer, the additional strain of the second strain condition having a crystallographic direction; wherein,
   forming the first strained single crystal piezoelectric layer and forming the second strained single crystal piezoelectric layer includes forming the first and second strained single crystal piezoelectric layers adjacent to each other, defining a strained single crystal piezoelectric bi-layer interface region, with the additional strain of the first strain condition and the additional strain of the second strain condition aligned in the same crystallographic direction at the interface region of the strained single crystal piezoelectric bi-layer such that at the interface region of the strained single crystal piezoelectric bi-layer has enhanced strain.

2. The method of claim 1 wherein the substrate is selected from one of a silicon substrate, a sapphire substrate, silicon carbide substrate, a GaN bulk substrate, a GaN template, an AlN bulk, an AlN template, $Al_xGa_{1-x}N$ templates, engineered substrates such as silicon on insulator (SOI), and polycrystalline AlN templates.

3. The method of claim 1 wherein forming the first and second single crystal piezoelectric layers includes epitaxially growing the first and second single crystal piezoelectric layers using an epitaxial growth process selected from one of a metal-organic chemical vapor deposition (MOCVD) process, a molecular beam epitaxy (MBE) process, a hydride vapor phase epitaxy (HVPE) process, an atomic layer deposition (ALD) process, a pulsed laser deposition process, and a plasma enhanced ALD process.

4. The method of claim 1 wherein the nucleation layer and the first and second strained single crystal piezoelectric layers include materials or alloys having at least one of AlN, AlGaN, GaN, InN, InGaN, AlInN, AlInGaN, ScAlN, ScGaN, and BN.

5. The method of claim 1 wherein the nucleation layer is defined by one or more nucleation growth parameters including temperature, pressure, thickness, growth rate, and gas phase ratio of reactant species; and wherein the first and second piezoelectric layers are defined by one or more first and second piezoelectric layer parameters including acoustic velocity, growth temperature, growth pressure, layer thickness, growth rate, gas phase ratio, the nucleation growth parameters used to form the nucleation layer, and the nucleation growth parameters used to form a nucleation layer including one or more transition layers.

6. The method of claim 1 wherein forming the first and second strained single crystal piezoelectric layers includes using an epitaxial growth process configured by the nucleation growth parameters and the first and second single crystal piezoelectric layer parameters to modulate the first and second strain conditions in the first and second strained single crystal piezoelectric layers, respectively, to improve one or more piezoelectric properties of the first and second strained single crystal piezoelectric layers.

7. The method of claim 1 wherein doping one or both of the first and second single crystal piezoelectric layers with the one or more impurity species occurs post-growth (ex-situ) after formation of one or both of the first and second single crystal piezoelectric layers; and wherein the one or more impurity species has an impurity concentration ranging from 1E+10 to 1E+21 per cubic centimeter.

8. The method of claim 1 wherein doping one or both of the first and second single crystal piezoelectric layers includes using a gas source to directly deliver the one or more impurity species or using an organometallic source to derive the source gas to deliver the one or more impurity species.

9. The method of claim 1, wherein forming the second strained single crystal piezoelectric layer having the second strain condition with additional strain by doping the second single crystal piezoelectric layer with one or more impurity species including scandium (Sc) occurs in-situ during the formation of the second single crystal piezoelectric layer having the second crystal lattice overlying the first single crystal piezoelectric layer.

10. The method of claim 1, wherein forming the first strained single crystal piezoelectric layer having the first strain condition with additional strain by doping the first single crystal piezoelectric layer with one or more impurity species including scandium (Sc) occurs in-situ during the formation of the first single crystal piezoelectric layer having the first crystal lattice overlying the nucleation layer.

11. The method of claim 10, wherein forming the second strained single crystal piezoelectric layer having the second strain condition with additional strain by doping the second single crystal piezoelectric layer with one or more impurity species including scandium (Sc) occurs in-situ during the formation of the second single crystal piezoelectric layer having the second crystal lattice overlying the first single crystal piezoelectric layer.

12. The method of claim 1, further comprising:
forming multiple strained single crystal piezoelectric bi-layers having enhanced strain interface regions between additional strained single crystal piezoelectric layers by:
forming two additional strained single crystal piezoelectric layers each having strain conditions with additional strain, when compared to corresponding single crystal piezoelectric layers, adjacent to each other and defining an additional strained single crystal piezoelectric bi-layer interface region by doping additional single crystal piezoelectric layers with one or more impurity species with the additional strains of the additional strain conditions aligned in the same crystallographic direction at the interface regions of the strained single crystal piezoelectric bi-layer such that the additional strained single crystal piezoelectric bi-layer has enhanced strain at the interface region.

13. The method of claim 12, wherein doping the additional single crystal piezoelectric layers with one or more impurity species includes doping the additional single crystal piezoelectric layers with one or more impurity species including silicon (Si), magnesium (Mg), carbon (C), oxygen (O), erbium (Er), rubidium (Rb), strontium (Sr), scandium (Sc), beryllium (Be), molybdenum (Mo), zirconium (Zr), Hafnium (Hf), or vanadium (Va).

14. A method for fabricating a single crystal electronic device, the method comprising:
providing a substrate having a substrate surface region;
forming a nucleation layer overlying the substrate surface region;
forming a first single crystal piezoelectric layer overlying the nucleation layer;
forming a first strained single crystal piezoelectric layer having a first strain condition with additional strain by doping the first single crystal piezoelectric layer with one or more impurity species including scandium (Sc) such that the first strain condition of the first strained single crystal piezoelectric layer has additional strain when compared to the first single crystal piezoelectric layer, the first strain condition having a crystallographic direction;
forming a second single crystal piezoelectric layer overlying the first single crystal piezoelectric layer;
forming a second strained single crystal piezoelectric layer having a second strain condition with additional strain by doping the second single crystal piezoelectric layer with one or more impurity species including scandium (Sc) such that the second strain condition has additional strain when compared to the second single crystal piezoelectric layer, the second strain condition having another crystallographic direction; and
forming a strained single crystal piezoelectric bi-layer having an enhanced strain interface region including:
producing an interface region of the strained single crystal piezoelectric bi-layer by forming the first strained single crystal piezoelectric layer and the second strained single crystal piezoelectric layer adjacent to each other; and
enhancing the strain at the interface region of the strained single crystal piezoelectric bi-layer by aligning the additional strain of the first strain condition of the first strained single crystal piezoelectric layer and the additional strain of the second strain condition of the second strained single crystal piezoelectric layer in the same crystallographic direction at the interface region of the strained single crystal piezoelectric bi-layer.

15. The method of claim 14 wherein the substrate is selected from one of a silicon substrate, a sapphire substrate, silicon carbide substrate, a GaN bulk substrate, a GaN template, an AlN bulk, an AlN template, $Al_xGa_{1-x}N$ templates, engineered substrates such as silicon on insulator (SOI), and polycrystalline AlN templates.

16. The method of claim 14 wherein forming the first and second single crystal piezoelectric layers includes epitaxially growing the first and second single crystal piezoelectric layers using an epitaxial growth process selected from one of a metal-organic chemical vapor deposition (MOCVD) process, a molecular beam epitaxy (MBE) process, a hydride vapor phase epitaxy (HVPE) process, an atomic layer deposition (ALD) process, a pulsed laser deposition process, and a plasma enhanced ALD process.

17. The method of claim 14 wherein the nucleation layer and the first and second strained single crystal piezoelectric layers include materials or alloys comprising at least one of AlN, AlGaN, GaN, InN, InGaN, AlInN, AlInGaN, ScAlN, ScGaN, and BN.

18. The method of claim 14 wherein the nucleation layer is defined by one or more nucleation growth parameters including temperature, pressure, thickness, growth rate, and gas phase ratio of reactant species; and wherein the first and second piezoelectric layers are defined by one or more first and second piezoelectric layer parameters including acoustic velocity, growth temperature, growth pressure, layer thickness, growth rate, gas phase ratio, the nucleation growth parameters used to form the nucleation layer, and the nucleation growth parameters used to form a nucleation layer including one or more transition layers.

19. The method of claim 14 wherein forming the first and second strained single crystal piezoelectric layers includes using an epitaxial growth process configured by the nucleation growth parameters and the first and second single crystal piezoelectric layer parameters to modulate the first and second strain conditions in the first and second strained single crystal piezoelectric layers, respectively, to improve one or more piezoelectric properties of the first and second strained single crystal piezoelectric layers.

20. The method of claim 14 wherein doping one or both of the first and second single crystal piezoelectric layers with the one or more impurity species occurs post-growth (ex-situ) after formation of one or both of the first and second single crystal piezoelectric layers.

21. The method of claim 14 wherein doping one or both of the first and second single crystal piezoelectric layers includes using a gas source to directly deliver the one or more impurity species or using an organometallic source to derive the source gas to deliver the one or more impurity species.

22. The method of claim 14, wherein forming the second strained single crystal piezoelectric layer having the second strain condition with additional strain by doping the second single crystal piezoelectric layer with one or more impurity species including scandium (Sc) occurs in-situ during the formation of the second single crystal piezoelectric layer having the second crystal lattice overlying the first single crystal piezoelectric layer.

23. The method of claim 14, wherein forming the first strained single crystal piezoelectric layer having the first strain condition with additional strain by doping the first single crystal piezoelectric layer with one or more impurity species including scandium (Sc) occurs in-situ during the formation of the first single crystal piezoelectric layer having the first crystal lattice overlying the nucleation layer.

24. The method of claim 23, wherein forming the second strained single crystal piezoelectric layer having the second strain condition with additional strain by doping the second single crystal piezoelectric layer with one or more impurity species including scandium (Sc) occurs in-situ during the formation of the second single crystal piezoelectric layer having the second crystal lattice overlying the first single crystal piezoelectric layer.

25. The method of claim 14, further comprising:
forming multiple strained single crystal piezoelectric bi-layers having enhanced strain interface regions between additional strained single crystal piezoelectric layers by:
   forming additional strained single crystal piezoelectric layers having strain conditions with additional strain adjacent to each other, producing additional strained single crystal piezoelectric bi-layer interface regions, by doping the additional single crystal piezoelectric layers with one or more impurity species such that each of the strain conditions of the additional single crystal piezoelectric layers has additional strain, when compared to a corresponding one of the additional single crystal piezoelectric layers: and
   aligning the additional strain conditions of the additional strained single crystal piezoelectric layers, the additional strain conditions each having a crystallographic direction, in the same crystallographic direction at the interface region of the additional single crystal piezoelectric bi-layers.

26. The method of claim 25, wherein doping the additional single crystal piezoelectric layers with one or more impurity species includes doping the additional single crystal piezoelectric layers with one or more impurity species including silicon (Si), magnesium (Mg), carbon (C), oxygen (O), erbium (Er), rubidium (Rb), strontium (Sr), scandium (Sc), beryllium (Be), molybdenum (Mo), zirconium (Zr), Hafnium (Hf), or vanadium (Va).

* * * * *